United States Patent
Nagayasu

Patent Number: 5,844,946
Date of Patent: Dec. 1, 1998

[54] SOFT-DECISION RECEIVER AND DECODER FOR DIGITAL COMMUNICATION

[75] Inventor: Takayuki Nagayasu, Tokyo, Japan

[73] Assignee: Mitsubishi Denki Kabushiki Kaisha, Tokyo, Japan

[21] Appl. No.: 653,279

[22] Filed: May 24, 1996

[30] Foreign Application Priority Data

Oct. 25, 1995 [JP] Japan ................... 7-277783

[51] Int. Cl.$^6$ .......................... G06F 11/00; H03M 13/00
[52] U.S. Cl. ..................... 375/341; 371/43.6; 371/43.7
[58] Field of Search ..................... 375/262, 341; 371/43.6, 43.7, 43.8

[56] References Cited

U.S. PATENT DOCUMENTS

| | | | |
|---|---|---|---|
| 4,240,156 | 12/1980 | Doland | 371/43.3 |
| 4,493,082 | 1/1985 | Cumberton et al. | 371/43.4 |
| 5,119,400 | 6/1992 | Koch . | |
| 5,140,617 | 8/1992 | Kubo | 375/365 |
| 5,146,475 | 9/1992 | Kubo | 375/341 |
| 5,164,964 | 11/1992 | Kubo | 375/347 |
| 5,181,209 | 1/1993 | Hagenauer et al. . | |
| 5,185,747 | 2/1993 | Farahati | 371/43.7 |
| 5,249,205 | 9/1993 | Chennakeshu et al. . | |
| 5,303,263 | 4/1994 | Shoji et al. | 375/229 |
| 5,414,738 | 5/1995 | Bienz | 375/341 |
| 5,502,723 | 3/1996 | Cooper | 371/43.6 |
| 5,533,047 | 7/1996 | Mourot et al. | 375/208 |
| 5,621,764 | 4/1997 | Ushirokawa et al. | 375/317 |
| 5,644,603 | 7/1997 | Ushirokawa | 375/341 |

FOREIGN PATENT DOCUMENTS 0425458  5/1991  European Pat. Off. .

OTHER PUBLICATIONS

IEEE Transactions on Information Theory, vol. IT–20, Mar. 1974, pp. 284–287, XP000647243, L.R. Bahl et al., "Optimal Decoding of Linear Codes for Minimizing Symbol Error Rate".

J. Hagenauer et al., "A Viterbi Algorithm with . . . Applications", IEEE GLOBECOM 89, vol. 3, Nov. 1989, pp. 47.1.1–47.1.7.

P. Hoeher, "TCM on Frequency–Selective Fading . . . Equalizers", IEEE GLOBECOM 89, vol. 1, Dec. 1990, pp. 401.4.1–401.4.6.

R. Mehlan et al., "Soft Output M–Algorithm and . . . Communication", IEEE VTC, May 1992, pp. 586–591.

Primary Examiner—Stephen Chin
Assistant Examiner—Jeffrey W. Gluck
Attorney, Agent, or Firm—Rothwell, Figg, Ernst & Kurz.

[57] ABSTRACT

A receiver for soft decision and decoding for deriving an appropriate soft-decision value so as to reduce the error rate at the output of a decoder such as a Viterbi decoder. A length V of transmission sequences that can be generated is set greater than a memory length L of a channel (V>L). By providing as many as 2N ($N=2^V$) branch metric producing circuits and as many as N add/compare/select apparatus (ACS apparatus) for respective states corresponding to combinations of transmission sequence data of V, the accuracy of a soft-decision value is enhanced. Further, a soft-decision value producing circuit performs a process not based on path metrics but based on survivor metrics. This allows a digital signal processor to easily perform the process.

20 Claims, 27 Drawing Sheets

SOFT-DECISION RECEIVER AND DECODER FOR DIGITAL COMMUNICATION

BACKGROUND OF THE INVENTION

1. Field of the Invention

The present invention relates to a receiver for soft-decision and decoding for use in digital data transmission/reception applications such as automobile telephones, and particularly, to apparatus which operates using what is known as "a soft-decision device".

2. Description of the Related Art

In general, a transmitter/receiver for use in digital data transmission has an error correcting function for correcting data errors caused in the channel. One type of code used for correction of such errors is a convolutional code wherein information and code words correspond one-to-one. The method which is used most frequently for decoding this convolutional code is Viterbi decoding.

Viterbi decoding is a decoding method which efficiently executes the maximum-likelihood decoding utilizing a repeat structure of the convolutional code. Although described later in detail, it is possible to correct an error on the way so as to achieve the correct decoding by selecting a path where a Hamming distance is smaller, in a state transition diagram (called a trellis diagram) determined by the state of an encoder and an input code. When forming the Hamming distance, there is a method which determines input data of a decoder in binary digit, that is, 0 or 1, and a method which determines input data of a decoder not in binary digit, but in a many valued fashion. The former is called a hard decision and the latter is called a soft decision. The soft decision reflects more on the reliability of information in transmission than the hard decision.

Prior to explanation of a receiver having a conventional soft-decision device, the technical background will be first explained for technical understanding, and thereafter, the conventional technique will be explained.

Technical Background on FIR Filter

The term FIR filter is an abbreviation for a finite impulse response filter wherein the impulse response is completed in a finite duration. FIG. 22 shows the structure of an FIR filter. The FIR filter gives delays to an inputted signal in sequence by delay elements (DELAY 1, DELAY 2, ..., DELAY L in the same figure), and adds a plurality of multiplication results by an adder (SUM in the same figure) after executing multiplication by tap coefficients $c_0, \ldots, C_L$ through multipliers (MULT 0, ..., MULT L). In general, a delay of the delay element is a constant value.

Technical Background on Channel Model Having Intersymbol Interference (ISI)

FIG. 23 shows a channel model having ISI. This model represents the transmission line characteristic using the FIR filter. In this model, a received signal is a Channel Impulse Response (CIR) composite signal of a direct signal in the form of a transmitted signal directly received and delayed signals received with delays due to reflection or the like. In the figure, time differences between the delayed signals are given by a delay circuit DELAY (shift register). The direct signal is obtained by multiplying transmitted signal $I_n$ and tap coefficient $c_{0,n}$ by the multiplier MULT0. Here, subscript n represents a time. The delayed signals are derived by multiplying delayed transmitted signals $I_{n-1}, \ldots, I_{n-L}$ and tap coefficients $c_{1,n} \ldots c_{L,n}$ through the multipliers MULT1 ... L, respectively. Then, outputs of the multipliers MULT0 ... L are synthesized by the adder SUM. Further, a composite wave outputted from the adder SUM is added with noise $w_n$ so as to be outputted as received signal $r_n$.

In case of absence of the ISI, received signal $r_n$ is expressed as the following equation:

$$r_n = c_{0,n} I_n w_n \tag{1}$$

In this case, if $c_{0,n}$ is known and the noise is small, $I_n$ can be easily estimated from $r_n$.

However, according to the model of FIG. 23, if transmission sequence $\{I_n\}$ is transmitted over the channel, the transmission sequence is subjected not only to the additive white Gaussian random noise (AWGN) $w_n$ but also to the ISI. Accordingly, received signal $r_n$ includes not only time n but also $I_n$ prior to it. Received signal $r_n$ at this time is expressed by the following equation:

$$r_n = \Sigma c_{i,n} I_{n-i} + w_n \tag{2}$$

wherein the sum $\Sigma$ is derived for $i=0, \ldots, L$, where L represents a time length (memory length of a CIR).

In the transmission line model of FIG. 23, the transmission sequences are included from time n to time (n−L).

On the other hand, when estimating $I_n$ from $r_n$, maximum-likelihood sequence estimation is frequently used.

Technical Background on Maximum-Likelihood Sequence Estimation using Viterbi Algorithm The maximum-likelihood sequence estimation using the Viterbi algorithm shown in "Maximum-likelihood sequence estimation of digital sequence in presence of intersymbol interference" (IEEE Trans. Information Theory, vol. IT-18, pp. 363–378, May 1972) written by G. D. Forney, Jr. will be explained in sequence.

The Viterbi algorithm is used most frequently as a decoding method of the convolutional code and equalizing the digital signals in the presence of ISI.

As a simple example of the convolutional code, it is assumed that a convolutional code of 2 bits is outputted relative to an input of 1 information bit. Since the 2-bit output is derived from the 1-bit input, the coding rate of this convolutional code is ½. In this example, 2 prior input bits are used to determine the output code for a particular input bid, and an encoder state is determined by 2-bit data already held.

On the other hand, according to the channel model having ISI in FIG. 23, the received signal is determined by not only the current transmitted signal but also the past transmitted signals. Accordingly, for estimating the current transmitted signal, it is also necessary to consider the past transmitted signals.

Candidates of transmission sequences formed by a combination of the past transmitted signals correspond to the states. If a shift register holds one symbol (L=1), there are two kinds of states, that is, the state [0] and the state [1]. On the other hand, if a shift register holds two symbols (L=2), there are four kinds of states, that is, state [0, 0], state [1, 0], state [0, 1] and state [1, 1]. In this manner, the state is expressed by a combination of the transmission sequences.

On the other hand, if a memory length of the Viterbi algorithm being the equalizing algorithm is given by V, state $S_n$ at time n and state $S_{n-1}$ at time n−1 can be expressed by equations (3) and (4), respectively:

$$S_n = [I_{n-V+1}, I_{n-V+2}, \ldots, I_n] \tag{3}$$

$$S_{n-1} = [I_{n-V}, I_{n-V+1}, \ldots, I_{n-1}] \tag{4}$$

Hereinafter, for simplification of expression, state $S_n$ may be simply expressed as $I_{n-V+1} I_{n-V+2} \ldots I_n$. For example, state [0, 1] is expressed as 01.

Here, by utilizing the nature that as many as V-1 transmission sequences from $I_{n-V+1}$ to $I_{n-1}$ in two states $S_n$ and $S_{n-1}$ take the same values, a trellis diagram of FIG. 24 can be prepared. The trellis diagram is a state transition diagram determined by the state of the channel and the input signal.

In FIG. 24, when the number U of candidates of the transmitted signals is 2 and the signal takes a binary digit, 0 or 1, the number M of states becomes 4 ($=U^V=2^2$). Specifically, in this example, since $I_n$ is 0, 1 and V=2, the trellis is formed for $S_n$ with four states 00, 10, 01 and 11. These states are assumed to be A, B, C and D.

In FIG. 24, the vertical direction represents states A, B, C and D in the order named from above, while the transverse direction represents time n-1, n, n+1, n+2, n+3 and n+4 in the order named from left. Segments are drawn from each state (blank circle) to two states at the next time, respectively. For example, from state A, two segments are drawn to states A and B. A segment from state A to state A represents input data being 0 and thus represents the states before and after the data input being both 00. A line from state A to state B represents the input data being 1 and thus represents a change from state 00 before the data input to state 10.

Segment $S_{n-1}/S_n$ in the trellis is called a branch. This branch is uniquely determined by transmission sequences $I_{n-V} \ldots I_n$. This is expressed as equation (5):

$$S_{n-1}/S_n = [I_{n-V}, I_{n-V+1}, \ldots, I_n] \tag{5}$$

For simplification of expression like the expression of the state, branch $S_{n-1}/S_n$ may be simply expressed as $I_{n-V}I_{n-V+1} \ldots I_n$. For example, branch [1, 0, 1] is expressed as 101.

On the other hand, if V=L, that is, a time length (memory length of the CIR) for which the ISI influences and a memory length of the Viterbi algorithm are equal to each other, estimate value (replica) $h_n$ of $r_n$ represented by equation (2) can be estimated uniquely as shown by equation (6):

$$h_n = \Sigma g_{i,n} I_{n-i} \tag{6}$$

wherein an estimated value of $c_{i,n}$ is represented by $g_{i,n}$ and the sum $\Sigma$ is derived for i=0, . . . , L.

In the trellis, mutually connected line $S_V S_{V+1} \ldots S_n$, n>V, is called a path. This path uniquely determines branches $S_V/S_{V+1}, S_{V+1}/S_{V+2}, \ldots, S_{n-1}/S_n$ and transmission sequences from $I_0$ to $I_n$.

In FIG. 25, path $S_{n-1} S_n \ldots S_{n+4}$ corresponding to transmission sequences $[I_{n-2}, I_{n-1}, \ldots, I_{n+4}] = [1, 0, 1, 1, 0, 0, 1]$ is shown using the trellis of FIG. 24. Thick lines represent the path, thick blank circles represent states the path transits, and each thick line connecting between the states is a branch determined by the path. FIG. 26 shows transitions of the states and the branches along the path of FIG. 25.

As seen from FIG. 26, data of the transmission sequences shift in order per two. For example, when the first two data 1, 0 of the transmission sequences are inputted, a state at time n-1 becomes 01. This is the state $S_{n-1}$.

Then, when data 1 is inputted, a state at time n becomes 10. This is the state $S_n$.

Similarly, when data 1001 is inputted, states $S_{n+1}, \ldots, S_{n+4}$ at time n+1, . . . , n+4 are 11, 01, 00, 10.

As in the foregoing manner, the path is determined as corresponding to transmission sequences $[I_{n-2}, I_{n-1}, \ldots, I_{n+4}]$ one by one.

On the other hand, if a path is determined, transmission sequences can be specified. For estimating a path from the received signals, estimation is performed at each branch. A branch metric is used for this. The branch metric represents the square error between received signal $r_n$ and replica $h_n$ reproduced by candidate $I_n$ and estimate value $g_{i,n}$ of the transmission sequence determined by each branch. The square error represents certainty of a transition from a state to the next state, that is, certainty of generation of a branch.

Replica $h_n[S_{n-1}/S_n]$ of $r_n$ can be derived from candidate values $I_{n-i}$ of transmission sequences from $I_{n-V}$ to $I_n$ determined by branch $S_{n-1}/S_n$ as follows:

$$h_n[S_{n-1}/S_n] = \Sigma g_{i,n} I_{n-i} \tag{7}$$

wherein the sum $\Sigma$ is derived for i=0, . . . , L.

The square error between the actual received signal $r_n$ and replica $h_n[S_{n-1}/Sn]$ determined by branch $[S_{n-1}/S_n]$, that is, branch metric $E_n[S_{n-1}/S_n]$, can be expressed as follows:

$$E_n[S_{n-1}/S_n] = \{ABS(r_n - h_n[S_{n-1}/S_n])\}^2 \tag{8}$$

wherein ABS() represents a vector length in the Euclidean space. In equation (8), the square of a distance between point $r_n$ and point $h_n[S_{n-1}/S_n]$ is represented.

Specifically, branch metric $E_n[S_{n-1}/S_n]$ is uniquely determined by branch $[S_{n-1}/S_n]$.

Further, the sum of the square errors, that is, the sum of all the branch metrics about the branches uniquely determined along the path, is called a path metric. At each state, there are the number U (U=2 in FIG. 24) of paths. Of these paths, a path having the minimum path metric is called a survivor. The survivor exists per state.

The process for deriving the survivor is the ACS process. ACS is an abbreviation for Add-Compare-Select.

The adding process is an operation for adding survivor metric $F_{n-1}[S_{n-1}]$ corresponding to one-time prior state $S_{n-1}$ and branch metric $E_n[S_{n-1}/S_n]$ as shown in equation (9):

$$F_n[S_{n-1}/S_n] = E_n[S_{n-1}/S_n] + F_{n-1}[S_{n-1}] \tag{9}$$

wherein $F_n[S_n]$ represents a survivor metric corresponding to state $S_n$, and $F_n[S_{n-1}/S_n]$ represents a path metric corresponding to branch $S_{n-1}/S_n$.

The comparing process is an operation for comparing the number U of path metrics prepared relative to each state. For the overall maximum-likelihood sequence estimation, since the number U of branches exist at each of the number M of states, the number (M·U) of path metrics are prepared.

The selecting process is an operation for selecting the minimum path metric at each state from the result of comparing process and selecting sequences corresponding to the selected path metric as a current survivor.

The foregoing is an explanation of the maximum-likelihood sequence estimation using the Viterbi algorithm. As described above, in the maximum likelihood sequence estimation shown by G. D. Forney, the received signal of a symbol rate is inputted and the ACS process is performed relative to each state recursively. After all the input signals are inputted, the survivor having the minimum survivor metric among the finally remaining survivors is determined as the maximum-likelihood path, and the only sequence (maximum-likelihood sequence) defined by this maximum-likelihood path is judged as the transmitted sequence.

Technical Background on Soft-Decision

The soft decision will be now explained in further detail. The convolutional coding is available as a kind of coding.

The optimum decoding method of the convolutional code uses the Viterbi algorithm. A better error rate is obtained by inputting not binary data (called a hard-decision value) such as 0 or 1, but data also including reliability (called a soft-decision value), for example, 0.2, 0.9 or the like, as an input of the Viterbi algorithm. Thus, by using the soft-decision value for decoding the convolutional code, the error rate can be improved. However, since the foregoing maximum-likelihood sequence estimation can not calculate the soft-decision value, the maximum a posteriori probability estimation is frequently used for calculation of the soft-decision value.

The maximum a posteriori probability estimation shown in "Optimal decoding of linear codes for minimizing symbol error rate" (IEEE Trans. Information Theory, vol. IT-20, pp. 284–287, Mar. 1974) written by L. R. Bahl and collaborator will now be explained.

It is assumed that the transmitted signal takes a binary digit of 0, 1. For calculating a probability of estimate value $I_{n-V+1}$ of the transmitted signal being 1 from the received signal suffering from ISI, the probability is calculated in which a path determined by the transmission sequences transits one of states, where $I_{n-V+1}=1$, among states $S_n$ in the foregoing trellis. Specifically, probability $P[I_{n-V+1}=1]$ of $I_{n-V+1}=1$ can be expressed as follows:

$$P[I_{n-V+1}=1]=\Sigma P[S_n] \qquad (10)$$

wherein $P[S_n]$ represents the probability in which a path determined by the transmission sequences passes state $S_n$, and can be expressed as the product of forward probability $P_f[S_n]$ depending on a probability of the state transition prior to time n in the trellis diagram and backward probability $P_b[S_n]$ depending on the probability of the state transition after time n. Further, the sum $\Sigma$ is derived for all the states $S_n$ where $I_{n-V+1}=1$.

First, the forward recursion will be explained. The forward recursion is a process for calculating the foregoing forward probability $P_f[S_n]$. If probabilities $P_E[S^0_{n-1}/S_n]$ and $P_E[S^1_{n-1}/S_n]$ of the branches connected to $S_n$ and forward probabilities $P_f[S^0_{n-1}]$ and $P_f[S^1_{n-1}]$ of one-time prior states $S^0_{n-1}$ and $S^1_{n-1}$ are known, forward probability $P_f[S_n]$ of state $S_n$ can be derived based on equation (11):

$$P_f[S_n]=P_f[S^0_{n-1}]P_E[S^0_{n-1}/S_n]+P_f[S^1_{n-1}]P_E[S^1_{n-1}/S_n] \qquad (11)$$

Accordingly, based on equation (11), the forward probabilities of all the states at the respective time from the initial points, where the probabilities are known, can be calculated recursively. The probability of the branch will be explained later.

Similarly, if probabilities $P_E[S_n/S^0_{n+i}]$ and $P_E[S_n/S^1_{n+1}]$ of the branches connected to $S_n$ and backward probabilities $P_b[S^0_{n+1}]$ and $P_b[S^1_{n+1}]$ of one-time after states $S^0_{n+1}$ and $S^1_{n+1}$ are known, backward probability $P_b[S_n]$ of state $S_n$ can be derived based on equation (12):

$$P_b[S_n]=P_b[S^0_{n+1}]P_E[S_n/S^0_{n+1}]+P_b[S^1_{n+1}]P_E[S_n/S^1_{n+1}] \qquad (12)$$

Accordingly, based on equation (12), the backward probabilities of all the states at the respective time from the terminal ends, where the probabilities are known, can be calculated recursively.

Thus, probability $P[I_{n-V+1}=1]$ at time n can be calculated using equation (13):

$$P[I_{n-V+1}=1]=\Sigma P_f[S_n]P_b[S_n] \qquad (13)$$

wherein the sum $\Sigma$ is derived for all the states $S_n$ where $I_{n-V+1}=1$.

If probability $P[I_{n-V+1}=1]$ is no less than 0.5, $I_{n-V+1}=1$ can be estimated, while if less than 0.5, $I_{n-V+1}=0$ can be estimated.

The foregoing is the explanation of the maximum a posteriori probability estimation. Based on this a posteriori probability, soft-decision value $y_{n-V+1}$ can be calculated using equation (14):

$$y_{n-V+1}=\log \left(P[I_{n-V+1}=1]/P[I_{n-V+1}=0]\right) \qquad (14)$$

wherein $P[I_{n-V+1}=0]$ represents a probability of $I_{n-V+1}=0$ and can be derived through calculation similar to $P[I_{n-V+1}=1]$.

If soft-decision value $y_{n-V+1}$ is no less than 0, then $I_{n-V+1}=1$ is determined, while if less than 0, then $I_{n-V+1}=0$ is determined. This is the hard decision. The absolute value of $y_{n-V+1}$ at this time represents its reliability.

Next, the probability of the branch will be explained. In the foregoing channel model, the generation probability of the branch can be expressed as equation (15):

$$P_E[S_{n-1}/S_n]=\{1/(2\pi)^{1/2}\sigma\}\cdot\exp(-E_n[S_{n-1}/S_n]/2\sigma^2) \qquad (15)$$

wherein $E_n[S_{n-1}/S_n]$ represents the branch metric in equation (8) and a $\sigma^2$ represents a noise power.

Further, as shown in equation (14), since the soft-decision value depends on the ratio between $P[I_{n-V+1}=1]$ and $P[I_{n-V+1}=0]$, when $\sigma^2$ is constant, even if equation (15) is changed to equation (16), the soft-decision value is not affected.

$$P_E[S_{n-1}/S_n]=\exp(-E_n[S_{n-1}/S_n]/2\sigma^2) \qquad (16)$$

Next, the calculation of the soft-decision value based on the branch metric will be explained.

Probabilities $P[I_{n-V+1}=1]$, $P_f[S_n]$ and $P_b[S_n]$ are expressed by metrics as equations (17) . . . (21):

$$P[I_{n-V+1}=1]=\exp(-P[I_{n-V+1}=1]) \qquad (17)$$

$$P_f[S_n]=\exp(-P_f[S_n]) \qquad (18)$$

$$P_b[S_n]=\exp(-P_b[S_n]) \qquad (19)$$

Then, equations (11) . . . (14) can be rewritten as equations (20) . . . (23):

$$P_f[S_n]=-\log \{\exp(-P_f[S^0_{n-1}]-E_n[S^0_{n-1}/S_n]/2\sigma^2) +\exp(-P_f[S^1_{n-1}]-E_n[S^1_{n-1}/S_n]/2\sigma^2)\} \qquad (20)$$

$$P_b[S_n]=-\log \{\exp(-P_b[S^0_{n+1}]-E_{n+1}[S_n/S^0_{n+1}]/2\sigma^2) +\exp(-P_b[S^1_{n+1}]-E_{n+1}[S_n/S^1_{n+1}]/2\sigma^2)\} \qquad (21)$$

$$P[I_{n-V+1}=1]=\Sigma\exp(-P_f[S_n]-P_b[S_n]) \qquad (22)$$

$$y_{n-V+1}=P[I_{n-V+1}=0]-P[I_{n-V+1}=1] \qquad (23)$$

In this manner, if the soft-decision value is calculated by the branch metric, the logarithmic and exponential operations are required to be executed frequently and a large-scale memory therefore becomes necessary so that it is difficult to perform the process in real time. Accordingly, equations (20) . . . (23) are therefore usually simplified for practical reasons in order to be applied to the soft-decision device.

Explanation of Receiver

Having a Conventional Soft-Decision Device

Next, an example of a conventional soft-decision device will be explained.

FIG. 27 is a block diagram of the conventional soft-decision device used in the typical signal detecting device.

This example is the soft-decision device which is described in an Unexamined Patent Publication No. 3-9617 and is used as an example for purposes of explanation.

In FIG. 27, numeral 11 denotes a received signal input terminal, 362 a CIR estimating circuit which estimates and outputs CIR $g_{i,n}$, 363-1 . . . 363-(2M) branch metric producing circuits each deriving branch metric $E_n[S_{n-1}/S_n]$ based on the received signal and the CIR, 364-1 . . . 364-M ACS circuits (if i=1, 2, . . . , M, the ACS circuit 364-i connects to the branch metric producing circuits 363-(2i−1) and (2i)) each executing the ACS process based on outputs of two branch metric producing circuits, 365 a shared memory connected to the ACS circuits 364-1 . . . M, 366-1 and 366-2 minimum value selecting circuits each selecting the minimum value among outputs of the ACS circuits 364-1 . . . M, 367 a subtraction circuit subtracting an output of the minimum value selecting circuit 366-2 from an output of the minimum value selecting circuit 366-1, and 17 a soft-decision value output terminal being an output end of this soft-decision device.

The branch metric producing circuits 363-1 . . . 2M have the same structure. The branch metric producing circuit 363-i is constituted by an FIR filter 3631-i, a memory 3632-i, a subtraction circuit 3633-i and a square circuit 3634-i. The branch metric producing circuit 363 performs the process corresponding to the foregoing equation (6).

The ACS circuits 364-1 . . . M have the same structure. FIG. 28 is a block diagram showing the inside of the ACS circuit 364. The ACS circuit 364-i is constituted by branch metric input terminals 3641a-i and 3641b-i, one-time prior survivor metric input terminals 3642a-i and 3642b-i, adders 3643a-i and 3643b-i, a comparator/selector 3644-i, path metric output terminals 3645a-i and 3645b-i, and a current-time surviving path metric output terminal 3646-i.

A typical operation of the conventional soft-decision device will be explained using FIG. 27. The transmitted signal takes a binary digit of 0, 1, $M(=2^V)$ represents the number of states and V=L.

First, the operation of the branch metric producing circuit 363-1 will be explained. The FIR filter 3631 receives candidates of transmission sequences corresponding to branches outputted from the memory 3632 and CIR (tap coefficients) estimated by the CIR estimating circuit 362 and outputs a replica (estimated value) of the received signal based on equation (6). The subtraction circuit 3633 receives the received signal and the replica outputted from the FIR filter 3631 and outputs a difference between the received signal and the replica. The square circuit 3634 squares the output of the subtraction circuit 3633 and outputs this value as a branch metric. The foregoing operation corresponds to equation (8). The branch metric producing circuits 363-2 . . . 363-(2M) operate similarly and output branch metrics corresponding to branches.

The M ACS circuits 364-1 . . . 364-M share the one-time prior and current-time survivor metrics through the shared memory 365, and these path metrics are accessible mutually. Each of the ACS circuits 364-1 . . . 364-M receives branch metrics outputted from two, among the branch metric producing circuits 363-1 . . . 363-(2M), corresponding to two branches connected to the state which corresponds to the corresponding one of the ACS circuits 364-1 . . . 364-M and one-time prior survivor metrics outputted from the shared memory 365 corresponding to one-time prior states connected via those two branches, and performs the ACS process based on equation (9), and further performs addition of the ACS process so as to output path metrics corresponding to the respective branches and a current-time surviving path metric.

Now, the operation of the ACS circuit 364-1 will be explained in further detail using FIG. 28. The adders 3643a and 3643b add the branch metrics inputted to the branch metric input terminals 3641a and 3641b and the one-time prior survivor metrics inputted to the one-time prior survivor metric input terminals 3642a and 3642b, respectively, and output the results via the path metric output terminals 3645a and 3645b, respectively.

The comparator/selector 3644 inputs the path metrics outputted from the adders 3643a and 3643b and outputs one of them having a smaller value from the current-time survivor metric output terminal 3646 as a current-time survivor metric.

The shared memory 365 receives the outputs of the ACS circuits 364-1 . . . 364-M and sets the current-time survivor metrics as one-time prior survivor metrics. In this manner, the shared memory 365 is updated.

The minimum value selecting circuit 366-1 receives the M path metrics corresponding to branches where the most prior transmitted signals of transmission sequences determined by the branches are 0, and outputs the minimum value thereof. The minimum value selecting circuit 366-2 receives M path metrics corresponding to branches where the most prior transmitted signals of transmission sequences determined by the branches are 1, and outputs the minimum value thereof.

The subtraction circuit 367 outputs the result of subtraction of the minimum value outputted from the minimum value selecting circuit 366-2 from the minimum value outputted from the minimum value selecting circuit 366-1 as a soft-decision value.

The foregoing operations will be explained concretely using a trellis shown in FIG. 29. Here, L=V=2 and M=$2^V$=4 are given to calculate a soft-decision value of transmitted signal $I_n$.

The FIR filter 3631-1 inputs candidates $[I_n, I_{n+1}, I_{n+2}]$=[0, 0, 0] of the transmission sequences corresponding to the branches outputted from the memory 3632-1 and CIR $g_0, g_1, g_2$ estimated at the CIR estimating circuit 362, and calculates replica $h_{+2}$ [000] of the received signal.

$$h_{n+2}[000]=g_0I_n+g_1I_{n+1}+g_2I_{n+2} \qquad (24)$$

The subtraction circuit 3633-1 receives received signal $r_{n+2}$ and replica $h_{n+2}[000]$ outputted from the FIR filter 3631-1 and calculates a difference $r_{n+2}-h_{n+2}[000]$ between the received signal and the replica. The square circuit 3634-1 squares $r_{n+2}-h_{n+2}[000]$ and outputs this value as branch metric $E_{n+2}[000]$.

$$E_{n+2}[000]=\{ABS(r_{n+2}-h_{n+2}[000])\}^2 \qquad (25)$$

The foregoing is the operation of the branch metric producing circuit 363-1. The other branch metric producing circuits 363-2 . . . 363-8 operate similarly and output branch metrics $E_{n+2}[100], E_{n+2}[010], \ldots, E_{n+2}[111]$ corresponding to branches 100, 010, . . . , 111.

The ACS circuit 364-1 inputs branch metrics $E_{n+2}[000]$ and $E_{n+2}[100]$ outputted from the branch metric producing circuits 363-1 and 363-2 corresponding to branches 000 and 100 connected to state 00 which corresponds to the ACS circuit 364-1, and one-time prior surviving path metrics $F_{n+1}$ [000] and $F_{n+1}$ [100], and derives path metrics corresponding to the next branches 000 and 100 through the adding process:

$$F_{n+2}[000]=E_{n+2}[000]+F_{n+1}[00] \qquad (26)$$

$$F_{n+2}[100]=E_{n+2}[100]+F_{n+1}[10] \quad (27)$$

Path metrics $F_{n+2}$ [000] and $F_{n+2}$ [100] are outputted to the minimum value selecting circuits 366-1 and 366-2. Further, through the comparator/selector 3644 in the ACS circuit, one of these two path metrics being smaller is outputted to the shared memory 365 as current-time survivor metric $F_{n+2}$ [00] corresponding to state 00. The ACS circuits 364-2 . . . 364-4 operate similarly to output current-time survivor metrics $F_{n+2}$ [10], $F_{n+2}$ [01] and $F_{n+2}$ [11] corresponding to states 10, 01 and 11 to the shared memory 365.

The minimum value selecting circuit 366-1 receives path metrics $F_{n+2}$ [000], $F_{n+2}$ [010], $F_{n+2}$ [001] and $F_{n+2}$ [011], where $I_n=0$, among the path metrics outputted from the ACS circuits 364-1 . . . 364-4, and outputs the minimum path metric among them. The minimum value selecting circuit 366-2 receives path metrics $F_{n+2}$ [100], $F_{n+2}$ [110], $F_{n+2}$ [101] and $F_{n+2}$ [111], where $I_n=1$, among the path metrics outputted from the ACS circuits 364-1 . . . 364-4, and outputs the minimum path metric among them. The subtraction circuit 367 subtracts the minimum value outputted from the minimum value selecting circuit 366-2 from the minimum value outputted from the minimum value selecting circuit 366-1 and outputs the result thereof at 17 as the soft-decision value.

This conventional example simplifies the calculation of the soft-decision value (equations (20) . . . (23)) based on the foregoing maximum a posteriori probability estimation as follows:

$$P_l[S_n]=\min\{(P_l[S^0_{n-1}]+E_n[S^0_{n-1}/S_n]), (P_l[S^1_{n-1}]+E_n[S^1_{n-1}/S_n])\} \quad (28)$$

$$P[I_{n-V}=1]=\min\{P_l[S_n]\} \quad (29)$$

wherein $S_n$ represents a value when $I_{n-V}=1$.

$$y_{n-V}=P[I_{n-V+1}=0]-P[I_{n-V+1}=1] \quad (30)$$

Here, $P_l[S_n]$ and $(P_l[S_{n-1}]+E_n[S_{n-1}/S_n])$ correspond to $F_n[S_n]$ and $F_n[S_{n-1}/S_n]$, respectively. Although this conventional example describes to derive soft-decision value $y_n$, equations (28) . . . (30) reference branch metric $E_n[S_{n-1}/S_n]$ and derive soft-decision value $y_{n-V}$ as calculated from $E_n[S_{n-1}/S_n]$.

Further, as shown in the trellis diagram of FIG. 29, the process of this conventional example selects the minimum paths, where $I_n=0$ and $I_n=1$, among all the paths relating to all the states $S_{n+2}$ at time (n+2), and determines a difference between path metrics $F_{n+2}[S_{n+2}]$ of these two paths to be the soft-decision value. In this manner, by simplification, this conventional example can calculate the soft-decision value with the process of a degree similar to the maximum-likelihood sequence estimation.

However, in the foregoing conventional example, the logarithmic/exponential operation is replaced by the comparing/selecting process, and further, the memory length V of the trellis and the memory length L of the estimated CIR are given to be equal so that the probability to be calculated through all the sequences from the initial point to the terminal end is calculated from the partial sequences from the initial point to time (n+L). Thus, an error is caused in the soft-decision value. Due to this error, when the Viterbi decoding is performed using the soft-decision value outputted from the soft-decision device of this conventional example, the error rate of the decoded data is impaired. As used in the present application, a soft-decision value which can improve the error rate of the decoded data will be referred to as a soft-decision value with high accuracy.

Further, the tap coefficient in the calculation of the branch metric includes an estimation error caused by noise or the like so that this error grows with the number of taps. Accordingly, although the memory length of the estimated CIR is fixed in this conventional example, if a memory length of the CIR is reduced in the channel where the memory length of the CIR changes, the soft-decision value with high accuracy can not be achieved due to unnecessary taps.

Further, if the CIR varies with a lapse of time, since the estimated CIR can not follow the variation in this conventional example, a soft-decision value with high accuracy can not be achieved in the time-variable channel.

Further, since this conventional example calculates the soft-decision value based on the path metrics being intermediate results of the ACS process, there is a problem that the circuit scale is increased in the DSP which performs at high-speed the calculation of the branch metrics and the ACS process en bloc. As described above, there have existed problems in the conventional soft-decision device in that a soft-decision value with high accuracy can not be achieved since the softecision value is calculated from the partial sequences of the received sequences, and further, the accuracy of the soft-decision value is fuirther impaired in the channel where the memory length of the estimated CIR and the tap coefficient change with a lapse of time, and the circuit scale is increased in the DSP which performs the high speed calculation of the branch metrics and the ACS process en bloc using the special purpose hardware.

SUMMARY OF THE INVENTION

The present invention is directed to solving the foregoing problems and thus has an object to provide a soft-decision device with improved functions, wherein a soft-decision with high accuracy can be achieved. Further, a soft-decision with high accuracy can be achieved even in the channel where the memory length of the estimated CIR and the tap coefficient change with a lapse of time, and the circuit scale can be reduced in the DSP which performs at high speed the calculation of the branch metrics and the ACS process en bloc.

The present invention, in one embodiment thereof, provides a receiver for receiving signals including encoded data via a channel, wherein transmission conditions of the received signals correspond states, transitions from certain states to next states, which are attendant upon reception of said received signal, correspond to branch metrics as indices of said transitions, path metrics are derived based on said branch metrics as indices of paths which are routes of said transitions when receiving said signal including encoded data in sequence, a soft decision is performed on a received signal by selecting a portion of said paths as survivors based on said path metrics, and decoding is performed using this result, comprises:

a soft-decision device for deriving survivor metrics per state based on said branch metrics, classifying said survivor metrics based on most prior transmitted signals in states corresponding to said survivors, and deriving a soft-decision value based on said classified survivor metrics; and a decoding circuit for performing decoding based on said soft-decision value.

DESCRIPTION OF THE PREFERRED EMBODIMENTS:

First Embodiment

A embodiment 1 of the present invention will be explained. In the embodiment of the present invention, a transmitted signal takes a binary digit of 0 or 1. Further, in the figures, components assigned the same signs represent the same or corresponding ones.

The first embodiment of the present invention will now be explained.

Figure 1:
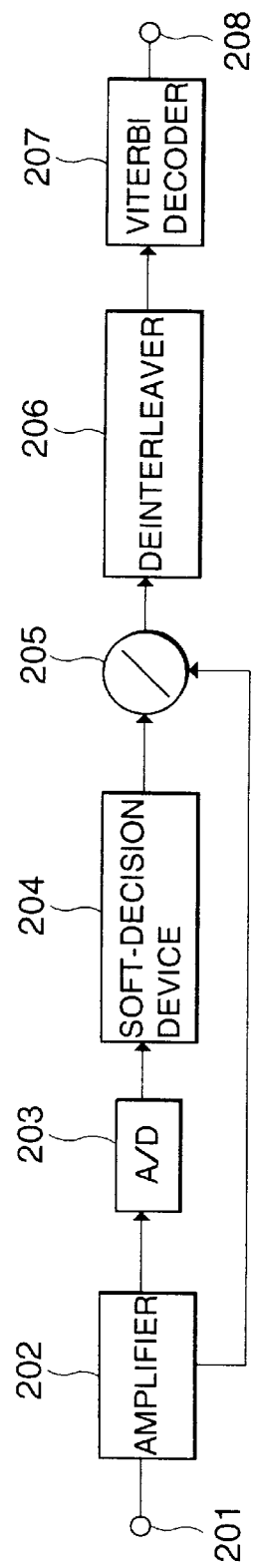
FIG. 1 is a block diagram of a receiver according to a first embodiment of the present invention.

FIG. 1 is a block diagram showing an example of a receiver according to the first embodiment. In the figure, 201 denotes a received signal input terminal, 202 an amplifier for amplifying a received signal, 203 an A/D converter for converting the amplified received signal from analog value to digital value, 204 a soft-decision device according to the present invention, 205 a division circuit for performing a compensation by dividing the derived soft-decision value by an output of the amplifying circuit 202, 206 a deinterleaver for rearranging the compensated soft-decision values by rule, 207 a Viterbi decoder for decoding the rearranged soft-decision values, and 208 a decoded data output terminal.

Next, the operation of the receiver of FIG. 1 including the soft-decision device will be explained.

The amplifier 202 amplifies the received signal with a gain $\beta_n$ so as to control an input level of the A/D converter 203 within an appropriate range.

The A/D converter 203 converts the amplified received signal from an analog signal to a digital signal.

The soft-decision device 204 calculates the soft-decision value from the received signal converted to the digital signal. The soft-decision device 204 forms an element with features which characterize the present invention. Details of this will be described later.

The division circuit 205 divides the soft-decision value outputted from the soft-decision device 204 by the gain $\beta_n$ outputted from the amplifier 202 so as to compensate the soft-decision value.

The deinterleaver 206 rearranges the corrected soft-decision values outputted from the division circuit 205 according to the rules.

The Viterbi decoder 207 inputs the rearranged soft-decision values and outputs the decoded data.

In the channel where a signal power of the received signals changes while a noise power is constant, a receiver amplifies the received signals with a gain $\beta_n$ for holding the received signals at a constant level. Then, since the noise power changes, it is necessary to compensate the soft-decision value in consideration of this change.

Here, the noise power in an input level of the amplifying circuit 202 is given by $\sigma^2$. The noise power after amplification becomes $(\beta_n \cdot \sigma^2)$. Accordingly, by normalizing the soft-decision value with $(\beta_n \cdot \sigma^2)$, that is, by dividing the soft-decision value by the noise power $(\beta_n \cdot \sigma^2)$ after amplification, the variation of the noise power in the amplifier 202 can be absorbed. Alternatively, since the soft-decision value has a meaning only as a relative value, it is sufficient to set $\sigma^2=1$ and divide the soft-decision value by the gain $\beta_n$.

According to the receiver of FIG. 1, by dividing the output of the soft-decision device 202 by the gain $\beta_n$ of the amplifier 202, a soft-decision with high accuracy can be achieved even in a channel where the signal power of the received signals changes while the noise power is constant.

Figure 2:
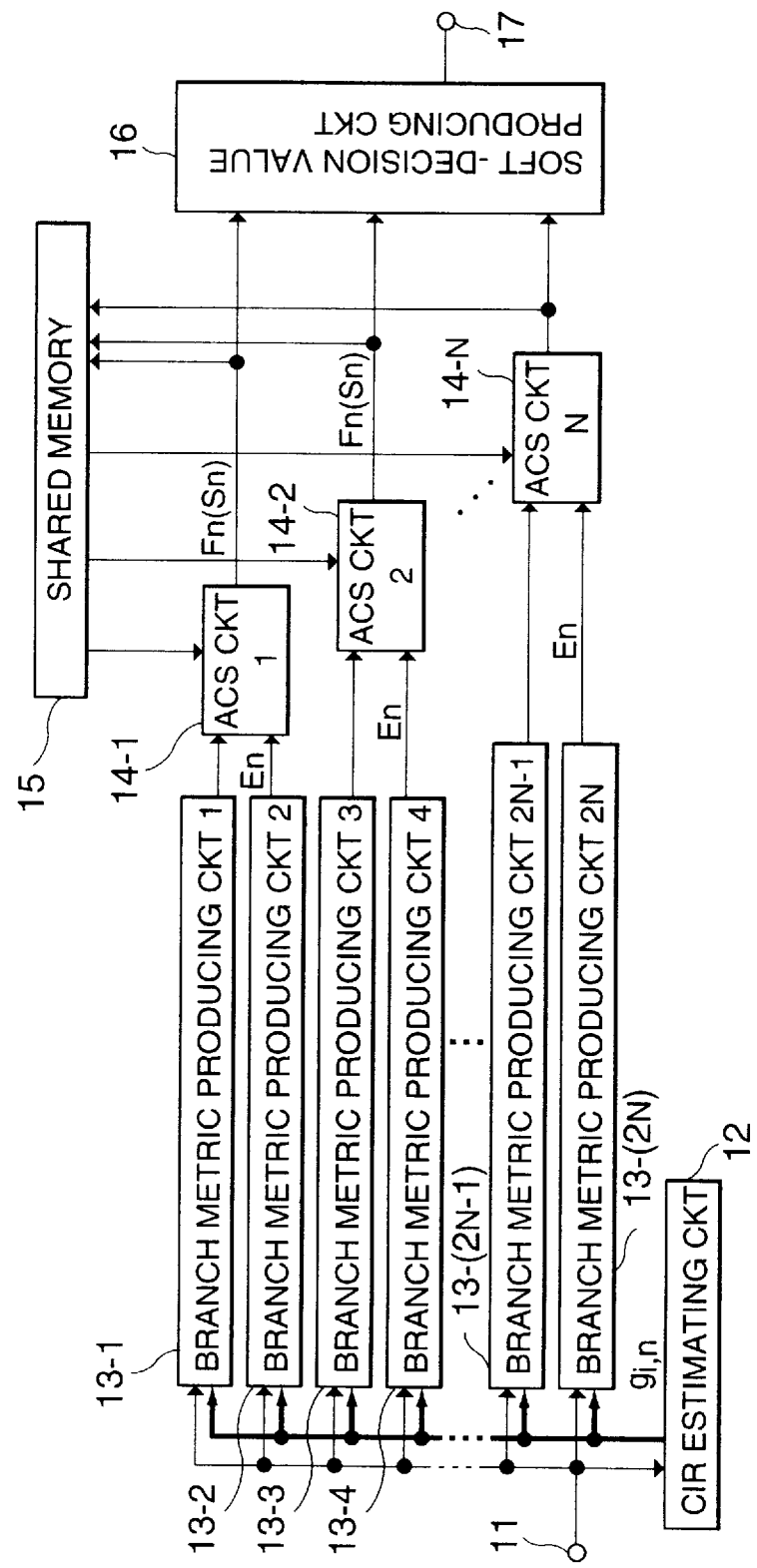
FIG. 2 is a block diagram of a soft-decision device according to the first embodiment of the present invention.

FIG. 2 is a block diagram showing the internal structure of the soft-decision device of FIG. 1.

In FIG. 2, 11 denotes a received signal input terminal, 12 a CIR estimating circuit which estimates and outputs CIR $g_{i,n}$ of the channel, 13-1 . . . 13-(2N) branch metric producing circuits provided corresponding to branches as many as 2N (here, $N=2^V$, $V \geq L$), respectively, in a trellis diagram where a memory length is given by V, and deriving branch metrics $E_n[S_{n-1}/S_n]$, respectively, based on the received signal and the CIR, 14-1 . . . 14-N ACS circuits (if i=1, 2, . . . , N, an ACS circuit 14-i connects to branch metric producing circuits 13-(2i–1) and (2i)) corresponding to states as many as N ($=2^V$), respectively, in the trellis where the memory length is given by V, and each performing the ACS process using outputs of two branch metric producing circuits, 15 a shared memory connected to the ACS circuits 14-1 . . . 14-N, 16 a soft-decision value producing circuit for producing a soft-decision value based on survivor metrics $F_n$ [$S_n$] outputted from the ACS circuits 14-1 . . . 14-N, and 17 a soft-decision value output terminal.

Here, N represents the number of states, L represents a period (CIR memory length) for which the ISI influences, and V represents a memory length of the Viterbi algorithm.

Figure 3:
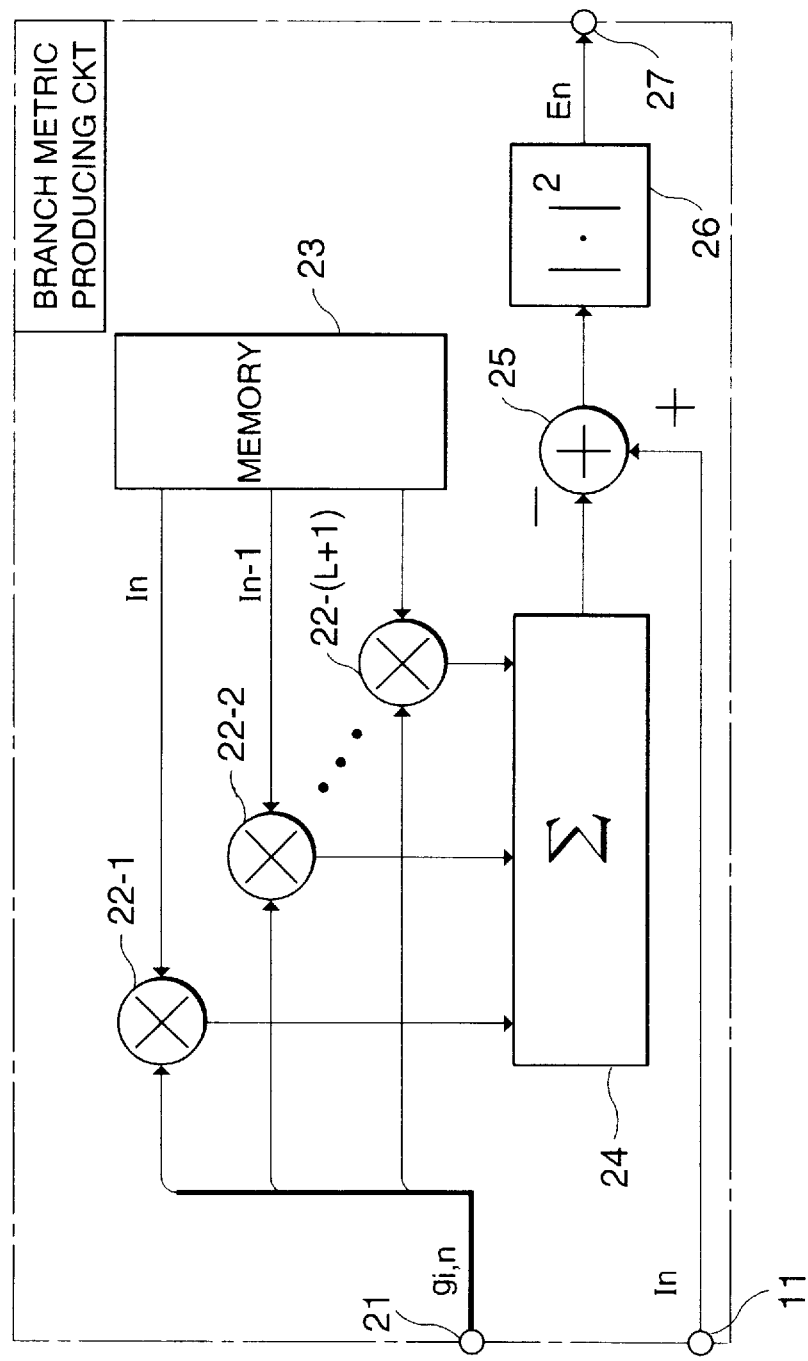
FIG. 3 is a block diagram of a branch metric producing circuit of a soft-decision device according to the first embodiment of the present invention.

The branch metric producing circuits 13-1 . . . 13-(2N) have the same structure. FIG. 3 is a detailed block diagram of the branch metric producing circuit 13-1. In the figure, 21 enotes an estimated CIR input terminal, 22-1 . . . 22-(L+1) multipliers for multiplying the estimated CIR $g_{i,n}$ and the transmission sequences $I_n$, respectively, 23 a memory for storing the transmission sequences $I_n$, 24 an adder for deriving the sum of outputs of the multipliers 22-1 . . . 22-(L+1), 25 a subtraction circuit for subtracting an output of the adder 24 from received signal $r_n$, 26 a square circuit for deriving the square of an output of the subtraction circuit 25, and 27 a branch metric output terminal.

Figure 4:
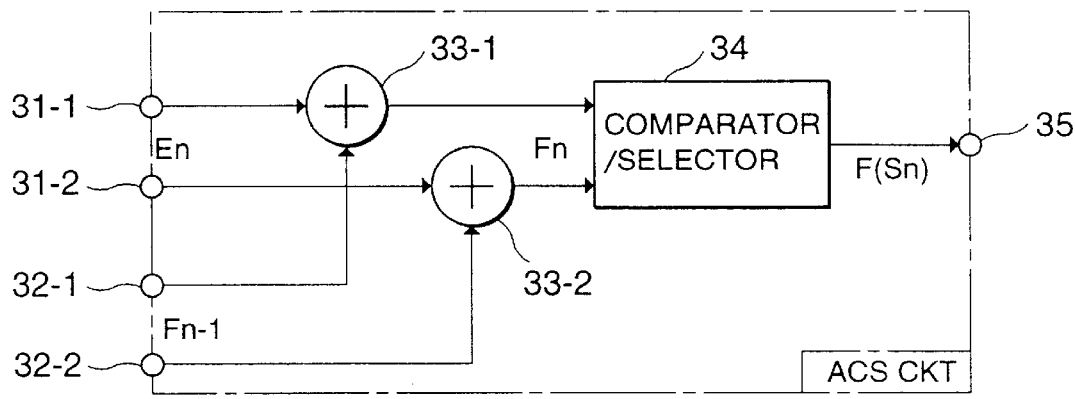
FIG. 4 is a block diagram of an ACS circuit of a soft-decision device according to the first embodiment of the present invention.

The ACS circuits 14-1 . . . 14-N have the same structure. FIG. 4 is a detailed block diagram of the ACS circuit 14-1. In the figure, 31-1 and 31-2 denote branch metric input terminals, 32-1 and 32-2 input terminals of one-time prior survivor metrics, 33-1 and 33-2 adders adding branch metrics and one-time prior survivor metrics to derive path metrics, respectively, 34 a comparator/selector circuit which selects smaller one of the path metrics and outputs it as a survivor metric, and 35 a survivor output terminal.

Figure 5:
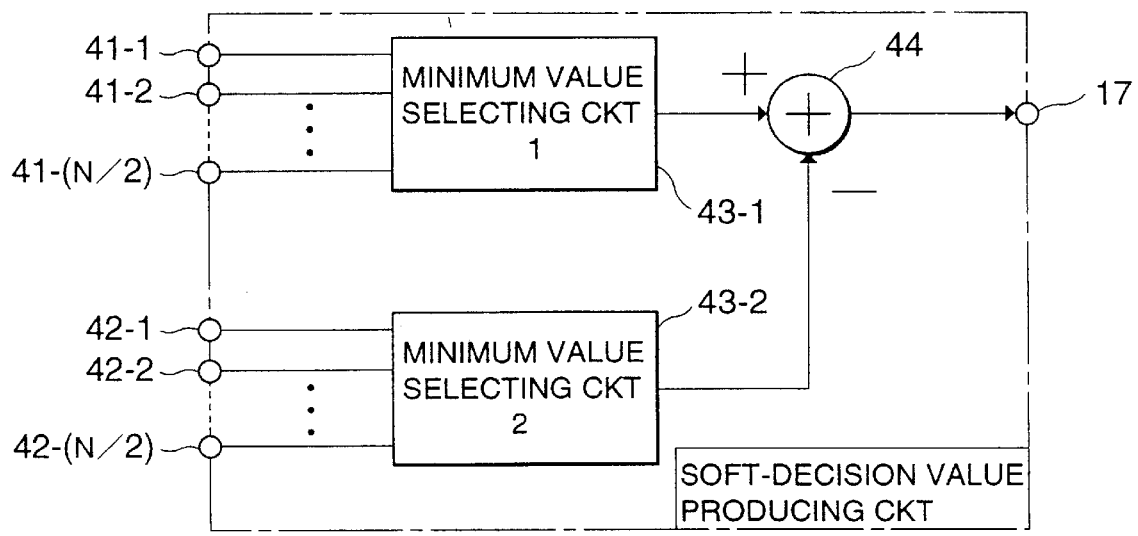
FIG. 5 is a block diagram of a soft-decision value producing circuit of a soft-decision device according to the first embodiment of the present invention.

FIG. 5 is a detailed block diagram of the soft-decision value producing circuit 16. In the figure, 41-1 . . . .41-(N/2) and 42-1 . . . 42-(N/2) denote survivor metric input terminals, 43-1 and 43-2 minimum value selecting circuits each selecting the minimum one from the inputted survivor metrics, and 44 a subtraction circuit.

Here, the survivor metrics inputted to the survivor metric input terminals 41-1 . . . 41-(N/2) correspond to those states, where the most prior symbols are "1". On the other hand, the survivor metrics inputted to the survivor metric input terminals 42-1 . . . 42(N/2) correspond to those states where the most prior symbols are "0". Based on these relationships, the ACS circuits 14-1 . . . 14-N and the soft-decision value producing circuit 16 are connected.

Next, operation of the soft-decision device will be explained.

First, the outline of the operation of the entire device will be described and then the details of the operation will be fuirther described.

The received signal is formed by a training signal for the purpose of estimating the CIR and an information signal for the purpose of transmitting the information. The training signal is assumed to be known at the side of the soft-decision device. Hereinafter, the information signal of the received signal will be referred to as the received signal, and the training signal of the received signal will be referred to as the training signal.

The CIR estimating circuit 12 estimates the CIR based on the training signal and the known information of the training signal and outputs $g_{i,n}$.

The branch metric producing circuits 13-1 . . . 13-(2N) as many as 2N receive received signal $r_n$ and estimated CIR $g_{i,n}$ outputted from the CIR estimating circuit and output branch metrics $E_n$ [$S_{n-1}/S_n$] based on transmission sequences $I_n$ corresponding to the branches stored in the memory 23, respectively.

The ACS circuit 14-1 receives the branch metrics outputted from two branch metric producing circuits corresponding to two branches connected to the state which corresponds to the ACS circuit 14-1, and one-time prior survivor metrics $F_{n-1}$ [$S_{n-1}$] outputted from the shared memory 15 corresponding to one-time prior states connected by those two branches so as to perform the ACS process and outputs a current time survivor metric $F_n$ [$S_n$]. The other ACS circuits 14-2 . . . 14-N operate similarly.

The shared memory 15 receives the current-time survivor metrics outputted from the ACS circuits 14-1 . . . 14-N to update the one-time prior survivor metrics.

The soft-decision value producing circuit 16 receives current-time survivor metrics $F_n$ [$S_n$] outputted from the ACS circuits 14-1 . . . 14-N to calculate the soft-decision value and outputs the soft-decision value from the soft-decision value output terminal 17.

Operation of the branch metric producing circuit 13-1 will be explained with reference to FIG. 3.

The multipliers 22-1 . . . 22-(L+1) calculate the products of the estimated CIR $g_{i,n}$ (tap coefficients of the FIR filter having the taps as many as (L+1)) inputted from the estimated CIR input terminal 21 and a portion of the candidates of the transmission sequences determined by the branches corresponding to the branch metric producing circuit 13-1 stored in the memory 23, that is, the newest transmitted signals of (L+1) symbols in the transmitted signals of (V+1) symbols determined by the branches. The adder 24 inputs the products as many as (L+I) outputted from the multipliers 22-1 . . . 22-(L+1) and calculates the sum thereof. The subtraction circuit 25 calculates a difference between the sum outputted from the adder 24 and the received signal. The square circuit 26 calculates the square of the difference outputted from the subtraction circuit 25 and outputs the result via the branch metric output terminal 27 as the branch metric.

Operation of the ACS circuit 14-1 will be explained using FIG. 4.

The branch metric input terminals 31-1 and 31-2 input the branch metrics outputted from the branch metric producing circuits 13-1 and 13-2 corresponding to two branches connected to the state which corresponds to the ACS circuit 14-1. The survivor metric input terminals 32-1 and 32-2 receive from the shared memory 15 the survivor metrics corresponding to one-time prior states connected by the two branches connected to the state which corresponds to the ACS circuit 14-1. The adders 33-1 and 33-2 calculate the sums of the branch metrics inputted via the branch metric input terminals 31-1 and 31-2 and the survivor metrics inputted via the survivor metric input terminals 32-1 and 32-2, respectively. The comparator/selector circuit 34 inputs the sums outputted from the adders 33-1 and 33-2 and compares the two sums to output the smaller one via the surviving path metric output terminal 35 as a current-time survivor metric.

Operation of the soft-decision value producing circuit 16 will now be explained using FIG. 5.

The survivor metric input terminals 41-1 . . . 41-(N/2) receive the survivor metrics outputted from the ACS circuits 14 corresponding to the states where the most prior transmitted signals forming the states are 0. On the other hand, the survivor metric input terminals 42-1 . . . 42-(N/2) receive the survivors outputted from the ACS circuits 14 corresponding to the states where the most prior transmitted signals forming the states are 1. The minimum value selecting circuit 43-1 receives the survivor metrics from the surviving path metric input terminals 41-1 . . . 41-(N/2) and selects the minimum survivor metric among them to output it. The minimum value selecting circuit 43-2 receives the survivor metrics from the survivor metric input terminals 42-1 . . . 42-(N/2) and selects the minimum survivor metric among them to output it. The subtraction circuit 44 calculates a difference between the output of the minimum value selecting circuit 43-1 and the output of the minimum value selecting circuit 43-2 and outputs the result thereof from the soft-decision value output terminal 15 as a soft-decision value.

Next, operation of the first embodiment will be explained using FIG. 6.

It is given that L=2, V=4 and $N=2^V=16$.

The branch metric producing circuits 13-1 . . . 13-32 are provided corresponding to branches $S_{n-1}/S_n$, respectively. The branch metric producing circuit 13 calculates the branch metric from equation (31) based on received signal $r_n$, estimated CIR $g_0$, $g_1$ and $g_2$, and candidates $I_{n-2, In-1}$ and $I_n$ of the transmitted signals held by each branch metric producing circuit 13.

$$E_n[S_{n-1}/S_n]=[ABS\{r_n-(g_0I_n+g_1I_{n-1}+g_2I_{n-2})\}]^2 \qquad (31)$$

wherein $I_{n-2}$, $I_{n-1}$ and $I_n$ represent three symbols among candidates $I_{n-4}$, $I_{n-3}$, $I_{n-2}$, $I_{n-1}$ and $I_n$ of the transmitted signals determined by branch $S_{n-1}/S_n$. These do not depend on time n, but are constantly fixed values in each branch metric producing circuit. Further, ABS represents an absolute value operator.

If estimated CIR $g_0$, $g_1$ and $g_2$ do not change, a replica derived from estimated CIRs $g_0$, $g_1$ and $g_2$ and candidates $I_2$ $[S_{n-1}/S_n]$, $I_3$ $[S_{n-1}/S_n]$ and $I_4$ $[S_{n-1}/S_n]$ of the transmitted signal, that is, the terms in parentheses of equation (31), is always constant. In this case, the branch metric producing circuit 13 may be arranged that a value of a replica is stored in the memory and updated only when the estimated CIRs are updated.

Next, the ACS producing circuits 14-1 . . . 14-16 are provided corresponding to states $S_n$, respectively. Concrete relationships are based on, for example, FIG. 6. The ACS producing circuit 14 receives the outputs of the branch metric producing circuits 13 orresponding to branches $S^0_{n-1}/S_n$ and $S^1_{n-1}/S_n$ connected to state $S_n$, that is, branch metrics $E_n$ $[S^0_{n-1}/S_n]$ and $E_n$ $[S^1_{n-1}/S_n]$. Further, the ACS producing circuit 14 receives survivor metrics $F_{n-1}$ $[S^0_{n-1}]$ and $F_{n-1}$ $[S^1_{n-1}]$ corresponding to one-time prior states $S^0_{n-1}$, and $S^1_{n-1}$ outputted from the shared memory 15. The ACS producing circuit 14 performs the adding process as expressed by equations (32) and (33) using these inputs so as to calculate the current-time path metrics:

$$F_n[S^0_{n-1}/S_n]=E_n[S^0_{n-1}/S_n]+F_{n-1}[S^0_{n-1}] \qquad (32)$$

$$F_n[S^1_{n-1}/S_n]=E_n[S^1_{n-1}/S_n]+F_{n-1}[S^1_{n-1}] \qquad (33)$$

Then, the ACS circuit 14 compares path metrics $F_n$ $[S^0_{n-1}/S_n]$ and $F_n$ $[S^1_{n-1}/S_n]$ derived from the foregoing equations (32) and (33) and outputs the smaller one as a current-time survivor metric $F_n$ $[S_n]$ corresponding to state $S_n$.

For example, the ACS circuit corresponding to state 1011 receives branch metrics $E_n[01011]$ and $E_n[11011]$ corresponding to branches 01011 and 11011, and survivor metrics $F_{n-1}$ $[0101]$ and $F_{n-1}$ $[1101]$ corresponding to one-time prior states 0101 and 1101, and calculates path metrics corresponding to branches 01011 and 11011 from equations (34) and (35):

$$F_n[01011]=E_n[01011]+F_{n-1}[0101] \qquad (34)$$

$$F_n[11011]=E_n[11011]+F_{n-1}[1101] \qquad (35)$$

Further, the ACS circuit compares path metrics $F_n$ $[01011]$ and $F_n$ $[11011]$ and outputs smaller one as survivor metric $F_n$ $[1011]$ corresponding to state 1011.

The soft decision value producing circuit 16 receives the survivor metrics outputted from the ACS circuits 14-1 . . . 14-16 and calculates soft-decision value $y_{n-3}$ from equation (36):

$$y_{n-3}=\min(F_n[S_n])-\min(F_n[S_n]) \qquad (36)$$

wherein the first term calculates the minimum survivor metric among the survivor metrics corresponding to the states where the most prior transmitted signals $I_{n-3}$ among the transmission sequences $I_{n-3}, I_{n-2}, I_{n-1}$ and $I_n$ determined by states $S_n$ become 0. The number of the transmission sequences $I_{n-3} \ldots I_n$ corresponds to N/2.

Further, the second term calculates the minimum survivor metric among the survivor metrics corresponding to the states where $I_{n-3}=1$.

Figure 6:
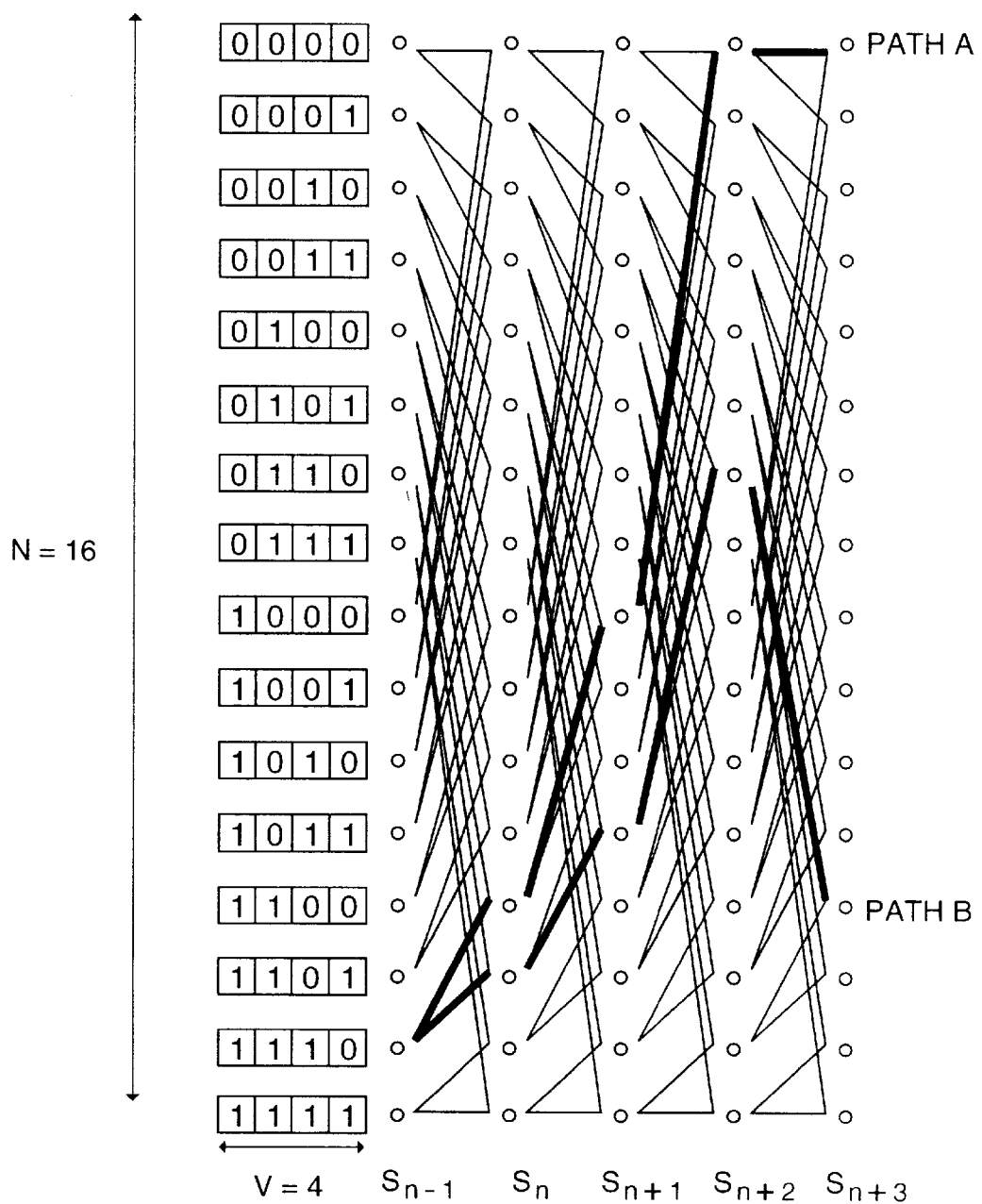
FIG. 6 is a trellis diagram for explaining a soft-decision method according to the first embodiment of the present invention, wherein V=4.

FIG. 6 is a trellis diagram showing an example, wherein soft-decision value $y_n$ of transmitted signal $I_n$ is calculated according to this first embodiment (L=2, V=4, $N=2^V=16$). Path A represents a path having the minimum survivor metric among the survivor metrics corresponding to states $S_{n+3}$ where $I_n=0$. Path B represents a path having the minimum survivor metric among the survivor metrics corresponding to states $S_{n+3}$ where $I_n=1$. The soft-decision value is calculated as a path metric difference between path A and path B.

Figure 7:
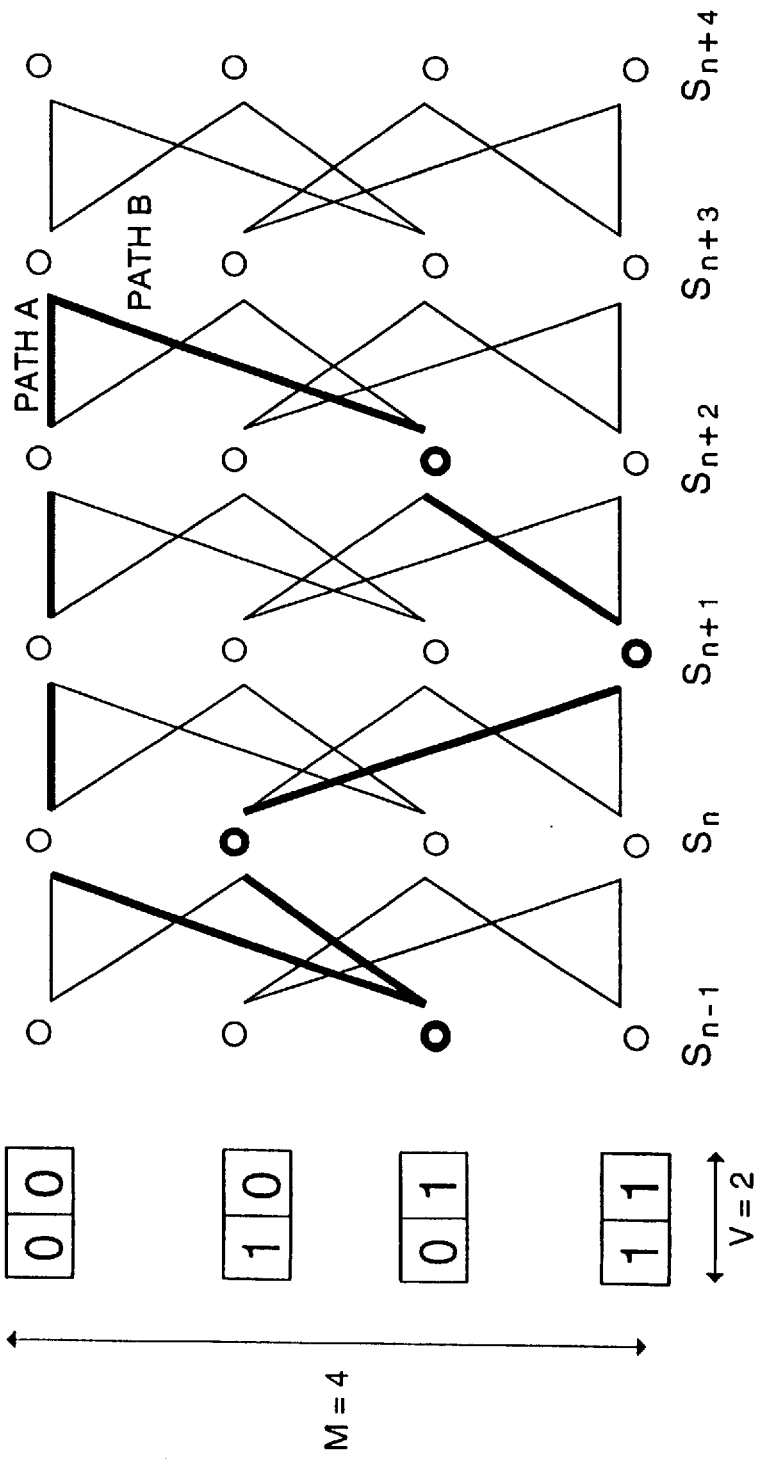
FIG. 7 is a trellis diagram for explaining a soft-decision method according to the first embodiment of the present invention, wherein V=2.
Figure 8:
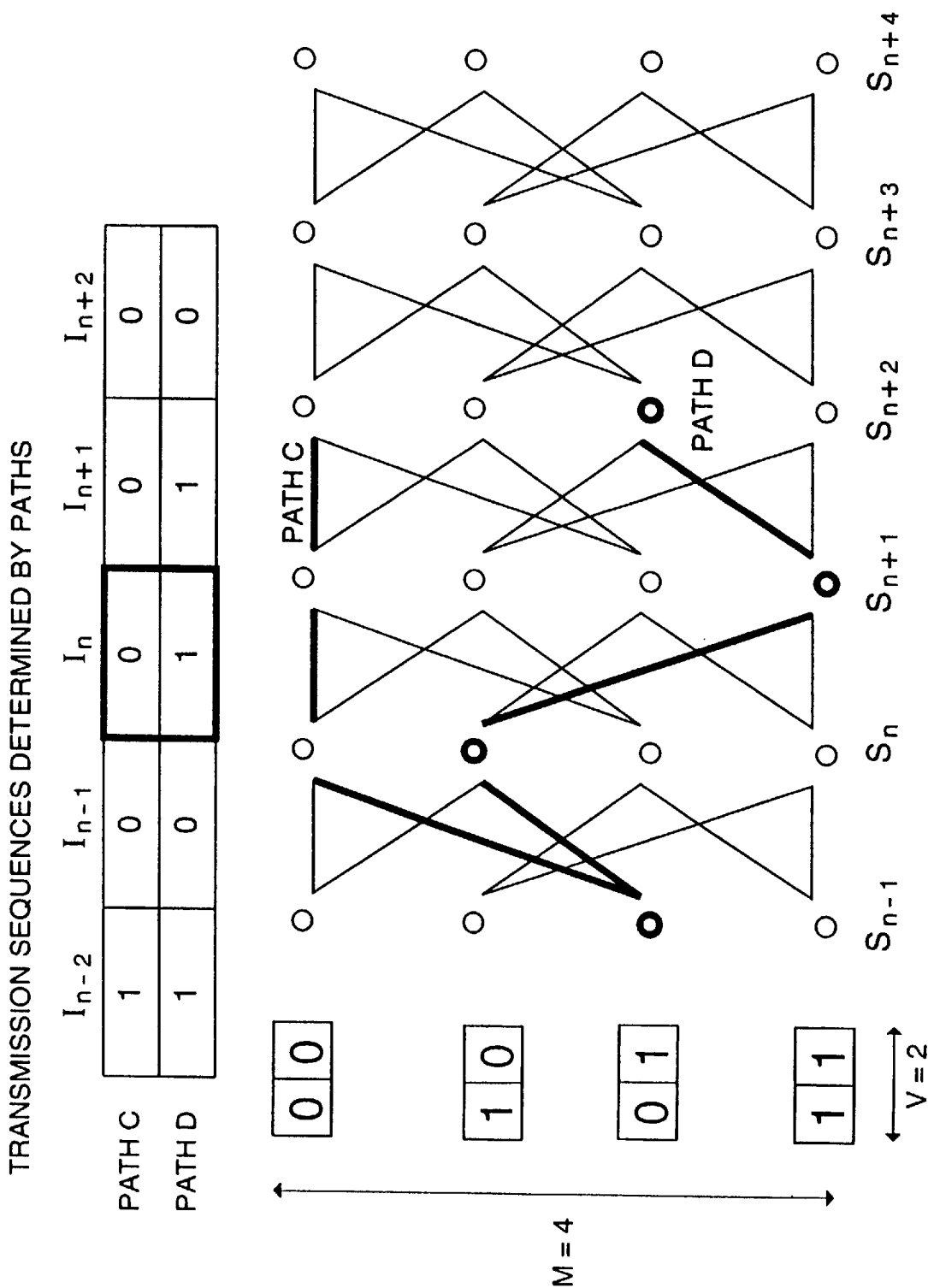
FIG. 8 is a trellis diagram of a conventional soft-decision method for comparing a soft-decision method according to the first embodiment of the present invention, wherein V=L=2.

For facilitating understanding, FIG. 7 shows paths forming transmission sequences equal to the transmission sequences determined by path A and path B of FIG. 6, on a trellis diagram where V=2. FIG. 8, for comparison with FIG. 7, shows an example wherein soft-decision value $y_n$ corresponding to transmitted signal $I_n$ is calculated based on the conventional example (L=V=2, $M=2^V=4$), on a trellis diagram.

In the conventional example, soft-decision value $y_n$ is calculated as a difference etween path C (this turns out to be a survivor corresponding to state $S_{n+2}=00$) orresponding to branch $S_{n+1}/S_{n+2}=000$ and path D (this turns out to be a survivor corresponding to state $S_{n+2}=10$) corresponding to branch $S_{n+1}/S_{n+2}=110$. On the other hand, in this first embodiment, the soft-decision value is calculated further using branches $S_{n+2}/S_{n+3}$ so that a soft-decision value with higher accuracy can be calculated as compared with the conventional example.

Figure 9:
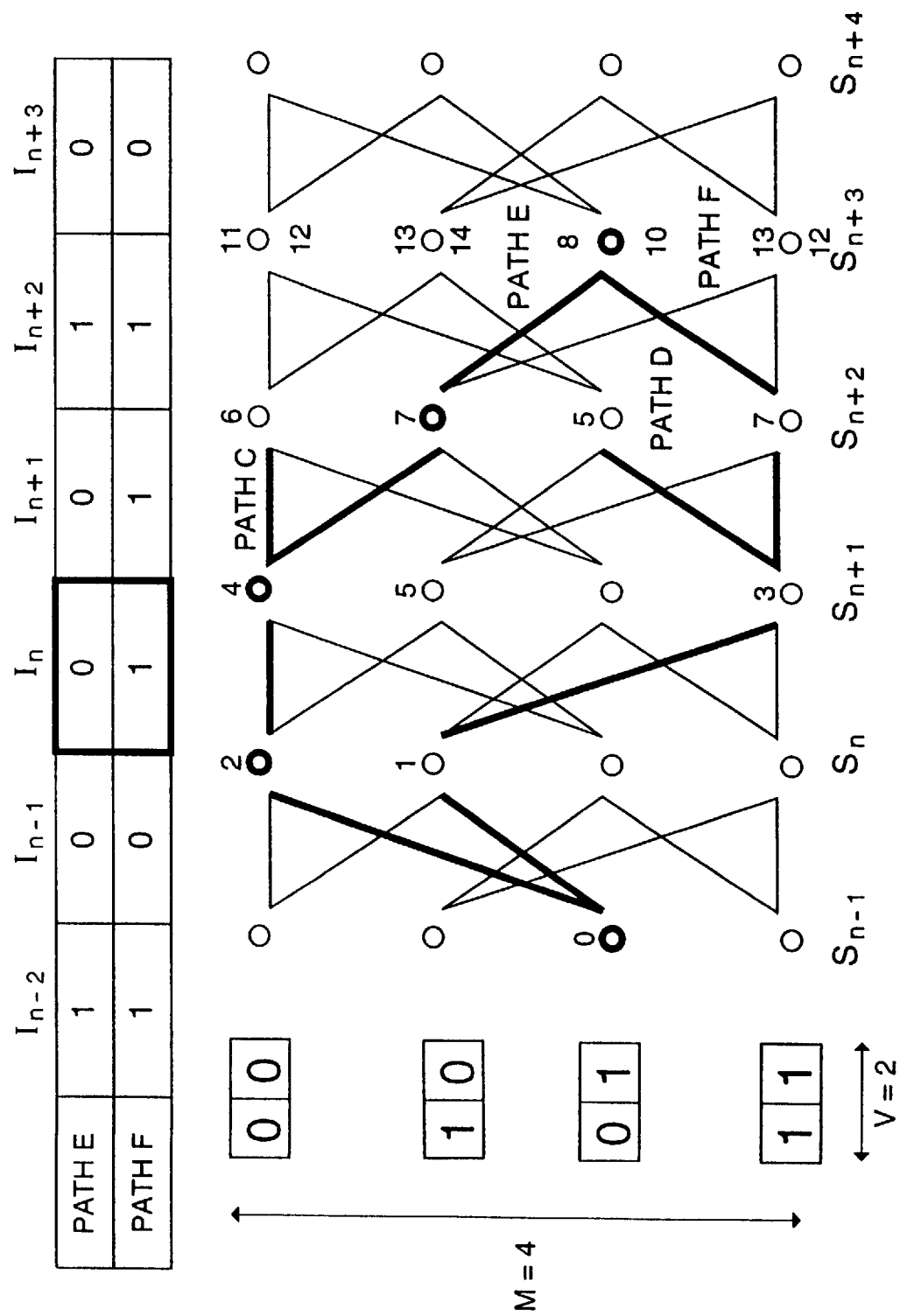
FIG. 9 is a trellis diagram for explaining a soft-decision method according to the first embodiment of the present invention, wherein V=2.

In the conventional example of FIG. 8, the accuracy of the soft-decision value can not be enhanced by simply extending path C and path D, which will be explained using FIG. 9. In the figure, numerals over the states represent survivor metrics corresponding to the respective states. On the other hand, numerals over and under states $S_{n+3}$ represent path metrics corresponding to branches connected to states $S_{n+3}$.

In the conventional example (V=L=2), the soft-decision value is calculated as a metric difference between path C and path D, and soft-decision value $y_n=1$. However, when considering paths connected to states $S_{n+3}$, path E has the minimum path metric among the paths where $I_n=0$ and path F has the minimum path metric among the paths wherein $I_n=1$. It is seen that either of path E and path F does not become a path extending from path C or path D. Here, if the soft-decision value is calculated by extending path C and path D, $y_n=1$. On the other hand, in this first embodiment (L=2, V=4), the soft-decision value is calculated as a metric difference between path E and path F, and soft-decision value $y_n=-2$.

In this manner, by setting the memory length V of the trellis to be greater than the memory length L of the estimated CIR, the soft-decision value with accuracy higher than the conventional example can be calculated. Conventionally, it has been considered that no effects can be achieved even by setting V greater than L. However, according to this first embodiment, not only the information of branches $S_{n+2}/S_{n+3}$ is simply added, but also the soft-decision value is calculated by considering paths after states $S_{n+3}$ when path A and path B join as in FIG. 6, so that the improvement in accuracy can be attained.

In the example of FIG. 7, they join at $S_{n+3}$. On the other hand, it is possible that they do not join until a subsequent state. However, by setting a difference between the memory length V of the trellis and the memory length L of the estimated CIR to a certain great extent, most of two paths used in the calculation of the soft-decision value join. When they join, it is deemed that the soft-decision value is calculated by considering the transmission sequence to its terminal end.

Figure 10:
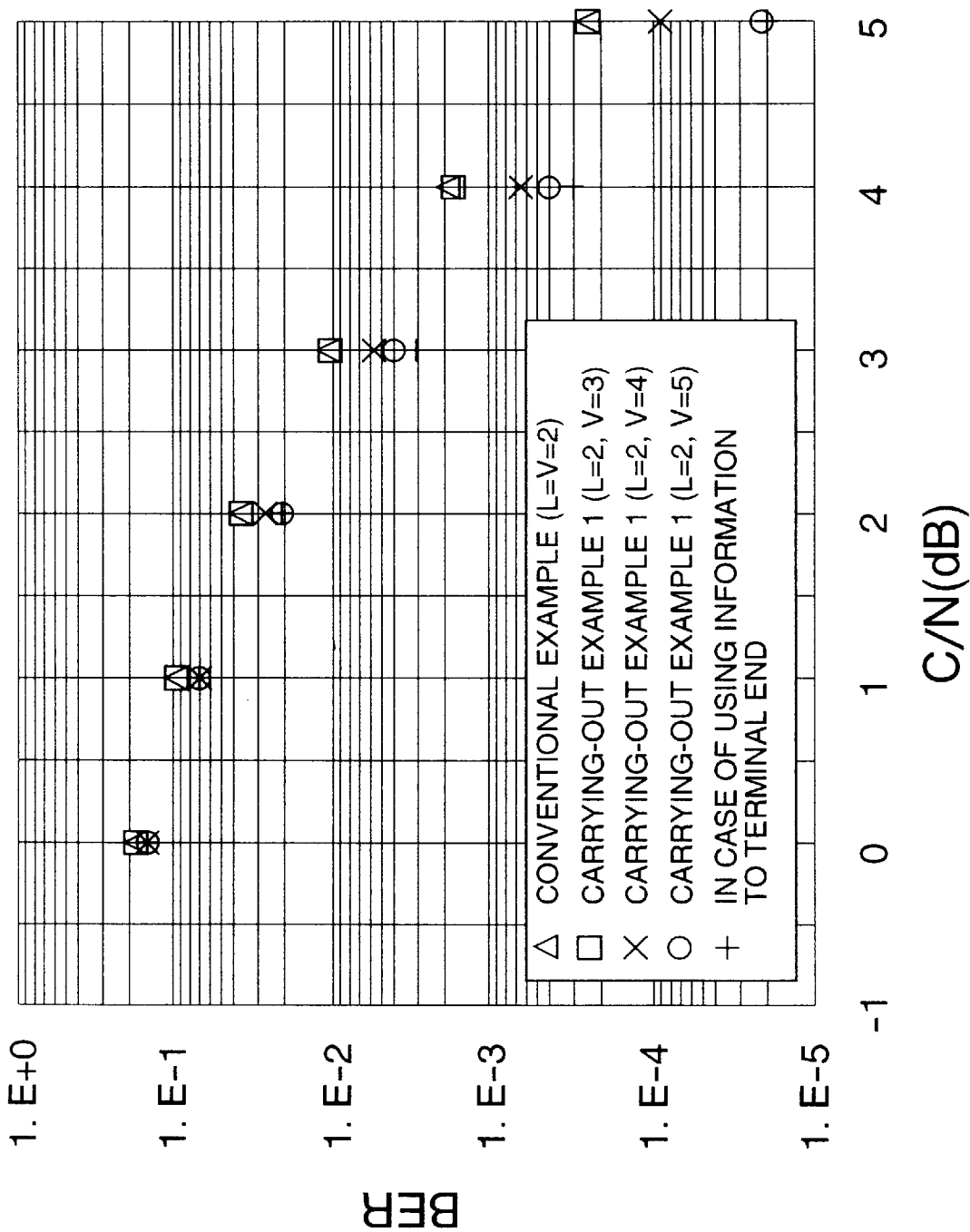
FIG. 10 is a graph showing BER vs. C/N for a receiver according to the first embodiment of the present invention. This graph is obtained through a computer simulation. This graph also includes plots for a conventional receiver for comparison.

The inventors have derived the effect of this invention quantitatively. FIG. 10 shows bit error rates (BERs) at the output of the Viterbi decoder of the receiver having the present soft-decision device, which computer simulation measures.

The BERs are the same in the conventional example (L=V=2) and the first embodiment where L=2 and V=3. This is because, in this case, there is no substantial difference between using the path metrics corresponding to the branches and using the survivor metrics corresponding to the states. However, as V is increased in the first embodiment, such as V=4, V=5, the BER becomes smaller than the conventional example. When V=5 or thereabouts, the BER becomes similar to the case where the transmission sequences are considered to their terminal end.

In FIG. 10, when C/N=3 dB, BER for V=4 is about $5\times10^{-3}$ and BER for V=5 is about $4\times10^{-3}$, while BER in the conventional example is about $1\times10^{-2}$. Similarly, when C/N=5 dB, BER for V=4 is about $1\times10^{-4}$ and BER for V=5 is about $2\times10^{-5}$, while BER in the conventional example is about $2\times10^{-4}$. BER in this invention is no greater than half of the conventional example.

In the first embodiment, the soft-decision value is calculated based on the survivor metrics (corresponding to the states) as results of the ACS process. On the other hand, in the conventional example, the soft-decision value is calculated based on the path metrics (corresponding to the branches) as intermediate results of the ACS process. In the first embodiment, it is not necessary to store the path metrics being the intermediate results or use them in calculation. Thus, the first embodiment can be easily structured, more so than conventionally, in the DSP (digital signal processor) which can perform at high-speed the calculation of the branch metrics and the ACS process en bloc.

Further, although the first embodiment sets the number U, which can be taken by the transmitted signal, to 2, it can be easily extended in case of the number greater than 2. It is more practical to use a combination of –1 and 1 rather than 0 and 1 as values which can be taken. Further, it may also be arranged that a value derived by multiplying the square error between the received signal and the replica by –1 is used as a branch metric, so as to select the maximum value instead of the minimum value in the ACS process and the calculation of the soft-decision value.

Further, in the foregoing description, explanation has been made to an example of applying to the Viterbi decoding, it is not limited to the Viterbi decoding, but can be applied to the soft-decision decoding algorithm in general. For example, it can be applied to the algebraic decoding, the maximum a posteriori probability decoding, the maximum-likelihood decoding and the sequential decoding.

Further, in the first embodiment, it may be considered that no deinterleave circuit is provided. Further, when the variation of the noise power can be ignored, it is not necessary to compensate the output of the soft-decision device using the gain of the amplifier.

Second Embodiment

The second embodiment of the present invention will now be explained. This embodiment of the invention is a structural example wherein the transmitted signal takes a binary digit of 0 or 1. In the figures, those components which are identified by the same reference numerals and/or symbols as those in the foregoing embodiment are the same or corresponding components.

Figure 11:
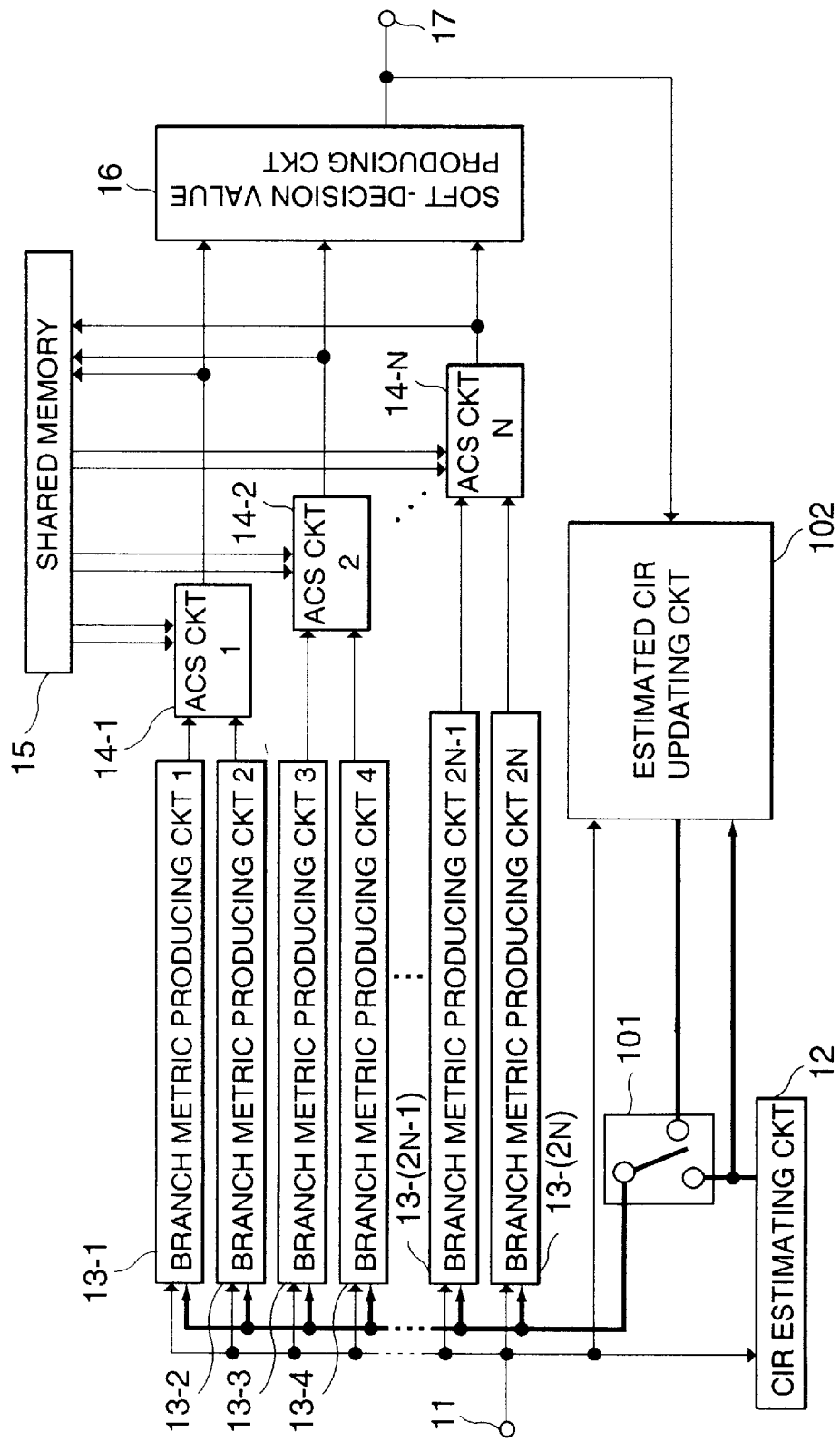
FIG. 11 is a block diagram of a soft-decision device according to a second embodiment of the present invention.

FIG. 11 is a block diagram showing the second embodiment of a soft-decision device of the present invention. In the figure, 11 denotes a received signal input terminal, 12 a CIR estimating circuit, 13-1 . . . 13-(2N) branch metric producing circuits provided corresponding to branches as many as 2N, respectively, in the trellis diagram where a memory length is given by V (N=$2^V$, V≧L), 14-1 . . . 14-N ACS circuits provided corresponding to states as many as N (=$2^V$), respectively, in the trellis diagram where the memory length is given by V, 15 a shared memory, 16 a soft-decision value producing circuit, and 17 a soft-decision value output terminal.

Further, 101 denotes a selector switch for selecting whether to supply the CIR required by the branch metric producing circuits 13 from the CIR estimating circuit 12 or an estimated CIR updating circuit 102, so as to supply them, and 102 denotes the estimated CIR updating circuit for updating the CIR based on the output of the soft-decision value producing circuit 16.

Next, the operation of the soft-decision device of the second embodiment will be explained using FIG. 11. The received signal is formed by a training signal for the purpose of estimating the CIR and an information signal for the purpose of transmitting the information. The training signal is assumed to be known at the side of the soft-decision device. Hereinafter, the information signal portion of the received signal will be referred to as the received signal, and the training signal portion of the received signal will be referred to as the training signal.

The CIR estimating circuit 12 estimates the CIR based on the training signal and the known information of the training signal. While the estimated CIR circuit 102 updates the estimated CIR depending on the soft-decision value relative to the received signal, the selector switch 101 performs the switching operation so as to input the updated estimated CIR to the branch metric producing circuits 13-1 . . . 13-(2N).

The estimated CIR updating circuit 102 receives the estimated CIR from the CIR estimating circuit 12, the received signal from the received signal input terminal 11 and the soft-decision value from the soft-decision value producing circuit 16, and updates the estimated CIR based on the LMS (Least Mean Square) algorithm, and then outputs the updated estimated CIR to the branch metric producing circuits 13-1 . . . 13-(2N).

The update of the estimated CIR is performed in the following manner. Here, the estimated CIR outputted from the estimated CIR updating circuit 102 are given by $g_{0,n}$, $g_{1,n}$, . . . , $g_{L,n}$. Subscript n represents a time.

Soft-decision value $y_n$ is converted to hard-decision value $x_n$. The estimated CIR are updated based on the algorithm (LMS algorithm) of equation (37), using hard-decision value $x_n$, the received signal $r_n$ and one-time prior estimated CIR $g_{0,n-1}$, $g_{1,n-1}$, . . . , $g_{L,n-1}$.

$$g_{i,n} = g_{i,n-1} + \alpha(r_n - \Sigma g_{j,n-1} \cdot x_{n-j}) \quad (37)$$

wherein i=0, . . . , L and the sum Σ is derived for j=0 . . . . L.

Here, α represents a step size of the update algorithm. The estimated CIR outputted from the CIR estimating circuit 12 is, as it is, used as an initial value $g_{i,0}$ of the estimated CIR in the update algorithm.

The branch metric producing circuits 13-1 . . . 13-(2N), the ACS circuits 14-1 . . . 14-N N, the shared memory 15 and the soft-decision value producing circuit 16 operate similarly as in the first embodiment.

In the second embodiment, by setting the memory length V of the trellis greater than the memory length L of the estimated CIR as in the first embodiment, the soft-decision value with accuracy higher than the conventional example can be achieved.

Further, in the second embodiment, when the CIR varies quickly, the soft-decision value with accuracy higher than the conventional example can be calculated by recursively updating the estimated CIR.

Further, in the second embodiment, the estimated CIR is updated per symbol. On the other hand, by updating the CIR per several symbols, the process volume can be reduced.

Further, by updating the estimated CIR in the estimated CIR updating circuit per symbol while updating the estimated CIR outputted to the branch metric producing circuits per several symbols only, the process volume which would be increased for updating the estimated CIR can be reduced.

Further, in the second embodiment, although the LMS algorithm is used for updating the estimated CIR, the update can be performed using other algorithms.

Further, in the second embodiment, the soft-decision value is calculated based on the survivor metrics (corresponding to the states) as results of the ACS process. On the other hand, in the conventional example, the soft-decision value is calculated based on the path metrics (corresponding to the branches) as intermediate results of the ACS process. Thus, the second embodiment can be easily structured, more so than conventionally, in the DSP which can high-speed calculate the calculation of the branch metrics and the ACS process en bloc.

Further, although the second embodiment sets the number U, which can be taken by the transmitted signal, to 2, it can be easily extended in case of the number greater than 2. It is more practical to use a combination of −1 and 1 rather than 0 and 1 as values which can be taken. Further, it may also be arranged that a value derived by multiplying the square error between the received signal and the replica by −1 is used as a branch metric, so as to select the maximum value instead of the minimum value in the ACS process and the calculation of the soft-decision value.

Third Embodiment

The third embodiment of the present invention will now be explained. This embodiment of the invention is a structural example wherein the transmitted signal takes a binary digit of 0 or 1. In the figures, those components which are designated by the same reference numerals and/or symbols as those in the foregoing embodiments are the same or corresponding components.

Figure 12:
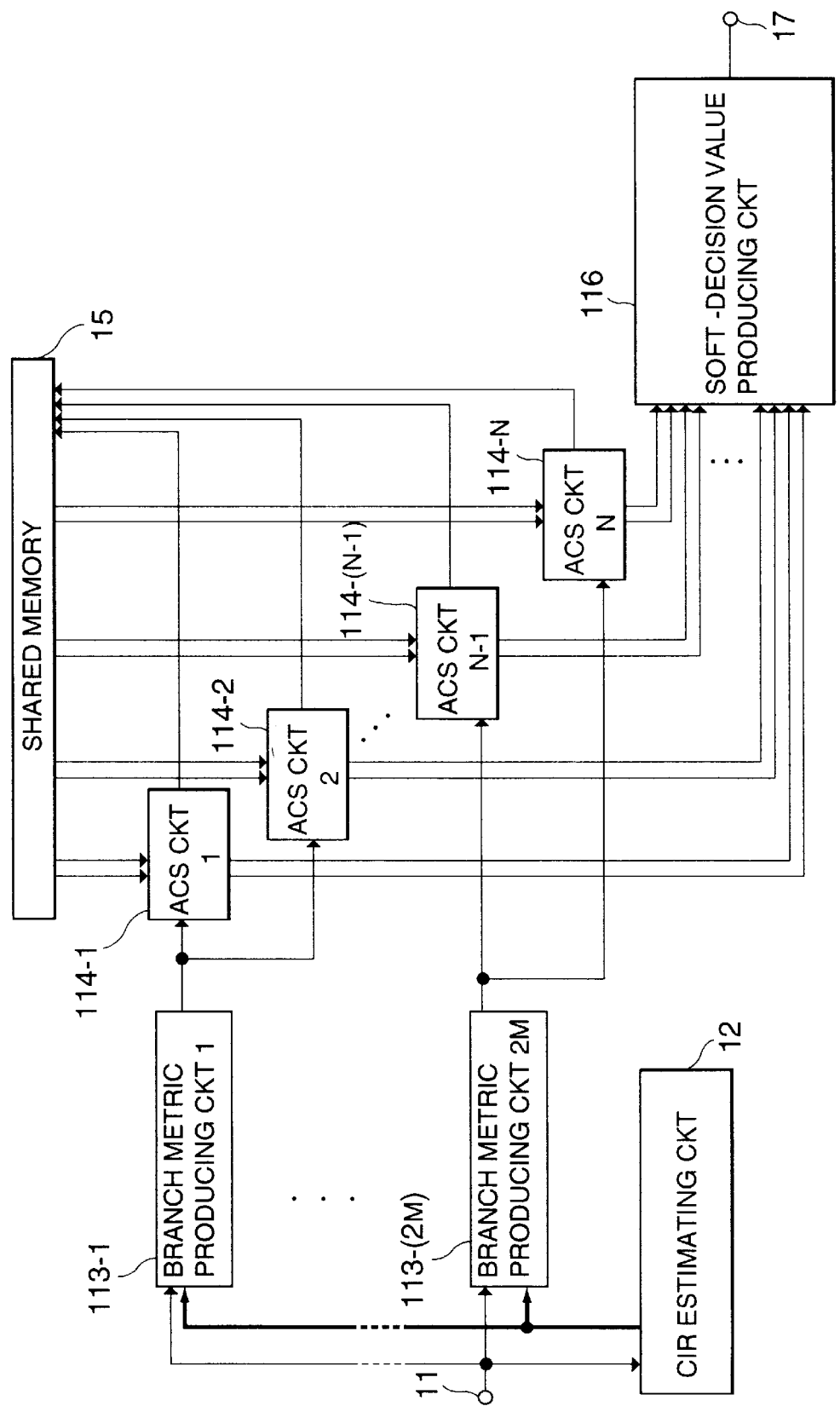
FIG. 12 is a block diagram of a soft-decision device according to a third embodiment of the present invention.

FIG. 12 is a block diagram showing the third embodiment of a soft-decision device of the present invention. In the figure, 11 denotes a received signal input terminal, 12 a CIR estimating circuit, 113-1 . . . 113-(2M) branch metric producing circuits as many as (2M) (M=$2^L$), 114-1 . . . 114-N ACS circuits provided corresponding to states as many as N (=$2^V$), respectively, in the trellis where the memory length is given by V, 15 a shared memory, 116 a soft-decision value producing circuit, and 17 a soft-decision value output terminal.

Figure 13:
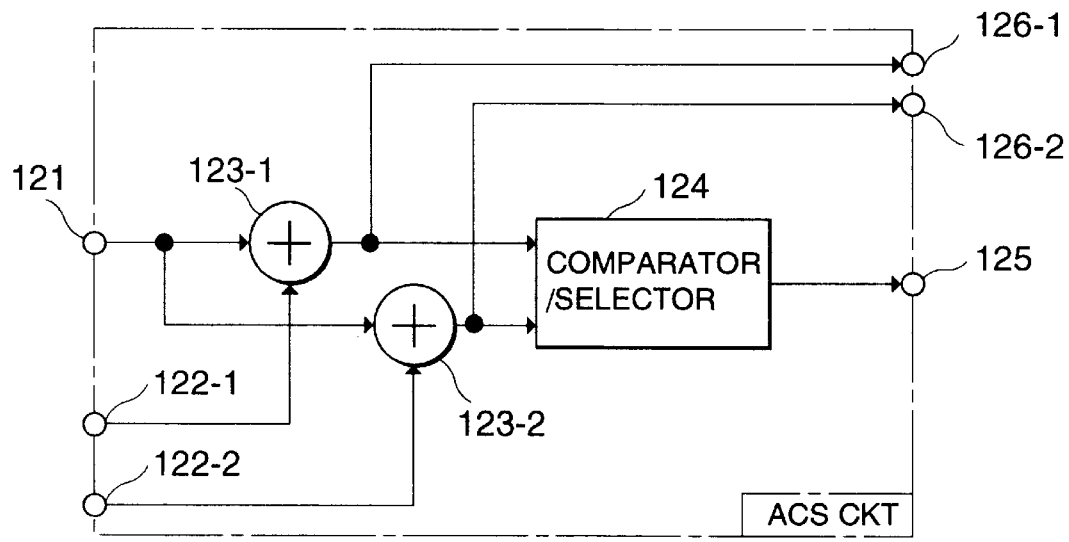
FIG. 13 is a block diagram of an ACS circuit of a soft-decision device according to the third embodiment of the present invention.

FIG. 13 is a detailed block diagram of the ACS circuit 114-1 in FIG. 11. In the figure, 121 denotes a branch metric input terminal, 122-1 and 122-2 input terminals of one-time prior survivor metrics, 123-1 and 123-2 adders, 124 a comparator/selector, 125 a survivor metric output terminal, and 126-1 and 126-2 path metric output terminals.

Figure 14:
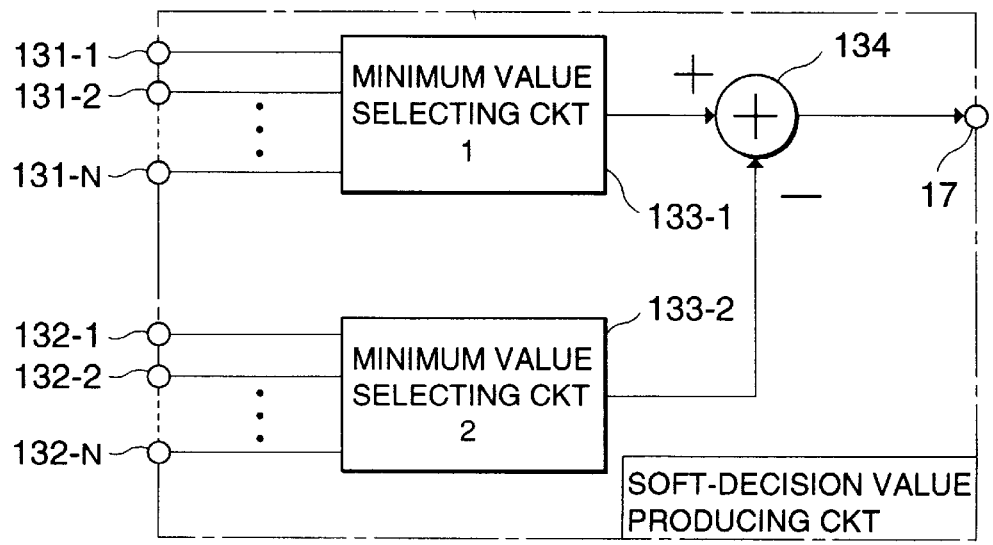
FIG. 14 is a block diagram of a soft-decision value producing circuit of a softdecision device according to the third embodiment of the present invention.

FIG. 14 is a detailed block diagram of the soft-decision value producing circuit 116 in FIG. 11. In the figure, 131-1 . . . 131-N and 132-1 . . . 132-N denote path metric input terminals, 133-1 and 133-2 minimum value selecting circuits, and 134 a subtraction circuit.

Next, an operation of the soft-decision device of the third embodiment will be explained using FIG. 12. The received signal is formed by a training signal for the purpose of estimating the CIR and an information signal for the purpose of transmitting the information. The training signal is assumed to be known at the side of the soft-decision device. Hereinafter, the information signal portion of the received signal will be referred to as the received signal, and the training signal portion of the received signal will be referred to as the training signal.

First, an outline of the operation will be explained, and thereafter, the specific process contents will be explained using equations.

The CIR estimating circuit 12 estimates the CIR based on the training signal and the known information of the training signal.

The branch metric producing circuits 113-1 . . . 113-(2M) as many as 2M receive the received signal from the received signal input terminal 11 and the estimated CIR outputted from the CIR estimating circuit 12 and output branch metrics based on the partial sequences of the transmission sequences corresponding to the branches, respectively.

The ACS circuit 114-1 receives a branch metric outputted from the branch metric producing circuit 113-1 which outputs the branch metric corresponding to branches connected to the state which corresponds to the ACS circuit 114-1, and one-time prior survivor metrics outputted from the shared memory 15 corresponding to one-time prior states connected by the two branches connected to the state corresponding to the ACS circuit 114-1, and outputs path metrics calculated by the adding process and a current-time survivor metric calculated by the ACS process. The other ACS circuits 14-2 . . . 14-N operate similarly.

The shared memory 15 receives the current-time survivor metrics outputted from the ACS circuits 114-1 ... 114-N to update the one-time prior survivor metrics.

The soft-decision producing circuit 116 receives path metrics outputted from the ACS circuits 114-1 ... 114-N to calculate the soft-decision value and outputs the soft-decision value from the soft-decision value output terminal 17.

Operation of the ACS circuit 114-1 will now be explained using FIG. 13.

The branch metric input terminal 121 receives the branch metric from the branch metric producing circuit 113-1 which outputs the branch metric corresponding to two branches connected to the state which corresponds to the ACS circuit 114-1.

The survivor metric input terminals 122-1 and 122-2 input from the shared memory 15 the survivor metrics corresponding to one-time prior states connected by the two branches connected to the state which corresponds to the ACS circuit 114-1.

The adders 123-1 and 123-2 calculate the sums of the branch metric inputted via the branch metric input terminal 121 and the survivor metrics inputted via the survivor metric input terminals 122-1 and 122-2, respectively.

The path metric output terminals 126-1 and 126-2 output the sums outputted from the adders 123-1 and 123-2, respectively. The comparator/selector 124 receives the sums outputted from the adders 123-1 and 123-2 and compares the two sums so as to output smaller one from the survivor metric output terminal 125 as a current-time survivor metric.

Operation of the soft-decision value producing circuit 116 will now be explained using FIG. 14.

The path metric input terminals 131-1 ... 131-N receive the path metrics corresponding to the branches where the most prior transmitted signals of the transmission sequences determined by the branches are 0. On the other hand, the path metric input terminals 132-1 ... 132-N receive the path metrics corresponding to the branches where the most prior transmitted signals of the transmission sequences determined by the branches are 1.

The minimum value selecting circuit 133-1 receives the path metrics from the path metric input terminals 131-1 ... 131-N and selects the minimum path metric among them to output it. The minimum value selecting circuit 133-2 receives the path metrics from the path metric input terminals 132-1 ... 132-N and selects the minimum path metric among them to output it.

The subtraction circuit 134 subtracts the output of the minimum value selecting circuit 133-2 from the output of the minimum value selecting circuit 133-1 and outputs this difference from the soft-decision value output terminal 15 as a soft-decision value.

The concrete operation of the third embodiment will be explained using FIG. 12.

It is given that L=2, V=4, M=$2^L$=4 and N=$2^V$=16.

The branch metric producing circuits 113-1 ... 113-8 are provided corresponding to combinations of 3 symbols $I_{n-2}$, $I_{n-1}$ and $I_n$ from the right (future side) among candidates $I_{n-4}$, $I_{n-3}$, $I_{n-2}$, $I_{n-1}$ and $I_n$ of the transmitted signals determined by branches $S_{n-1}/S_n$, respectively. The branch metric producing circuit 113 calculates the branch metric based on equation (38) using received signal $r_n$, estimated transmission line characteristics $g_0$, $g_1$ and $g_2$, and candidates $I_{n-2}$, $I_{n-1}$ and $I_n$ of the transmission sequences corresponding to each branch metric producing circuit.

$$E_n[XXI_{n-2}I_{n-1}I_n]=[ABS\ \{r_n-(g_0I_n+g_1I_{n-1}+g_2I_{n-2})\}]^2 \quad (38)$$

Although the expression of branch $S_{n-1}/S_n$=$I_{n-4}$ $I_{n-3}$ $I_{n-2}$ $I_{n-1}$ $I_n$ has been used, since the branch metric in equation (38) can be determined uniquely free of $I_{n-4}$ and $I_{n-3}$, $XXI_{n-2}$ $I_{n-1}$ $I_n$ is used. X represents an arbitrary transmitted signal.

If estimated CIR $g_0$, $g_1$ and $g_2$ do not change, a replica derived from estimated CIR $g_0$, $g_1$ and $g_2$ and candidates $I_{n-2}$, $I_{n-1}$, $I_n$ of the transmitted signals, that is, the terms in parentheses of equation (38), is always constant. In this case, it may also be arranged that this value is stored in the memory and updated only when the estimated CIR are updated.

Next, the ACS circuits 114-1 ... 114-16 are provided corresponding to states $S_n$, respectively. The ACS circuits 114-1 ... 114-16 receive branch metrics $E_n$ $[XXI_{n-2}\ I_{n-1}\ I_n]$ outputted from the branch metric producing circuits 113 each of which outputs the branch metric corresponding to both branches $S^0_{n-1}/S_n$ and $S^1_{n-1}/S_n$ connected to state $S_n$, and survivor metrics $F_n[S^0_{n-1}]$ and $F_n[S^1_{n-1}]$ corresponding to one-time prior states $S^0_{n-1}$ and $S^1_{n-1}$ outputted from the shared memory 15, and perform the adding process as expressed by equations (39) and (40) so as to calculate the current-time path metrics:

$$F_n[S^0_{n-1}/S_n]=E_n[XXI_{n-2}I_{n-1}I_n]+F_{n-1}[S^0_{n-1}] \quad (39)$$

$$F_n[S^1_{n-1}/S_n]=E_n[XXI_{n-2}I_{n-1}I_n]+F_{n-1}[S^1_{n-1}] \quad (40)$$

Then, the ACS circuits 114-1 ... 114-16 each output path metrics $F_n[S^0_{n-1}/S_n]$ and $F_n[S_{n-1}/S_n]$ from the path metric output terminals 126-1 and 126-2 and compare these two path metrics to output smaller one as survivor metric $F_n[S_n]$ corresponding to state $S_n$.

For example, the ACS circuit 114 corresponding to state 1011 inputs branch metric $E_n$ [XX011], and survivor metrics $F_{n-1}$ [0101] and $F_{n-1}$ [1101] corresponding to one-time prior states 0101 and 1101, and calculates path metrics corresponding to branches 01011 and 11011 from equations (41) and (42):

$$F_n[01011]=E_n[XX011]+F_{n-1}[0101] \quad (41)$$

$$F_n[11011]=E_n[XX011]+F_{n-1}[1101] \quad (42)$$

The ACS circuit 114 compares path metrics $F_n$ [01011] and $F_n$ [11011] and outputs smaller one as survivor metric $F_n$ [1011] corresponding to state 1101.

The soft decision value producing circuit 116 receives the path metrics outputted from the ACS circuits 114-1 ... 114-16 and calculates soft-decision value $y_{n-4}$ from equation (43):

$$y_{n-4}=\min(F_n[S_{n-1}/S_n])-\min\ (F_n[S_{n-1}/S_n]) \quad (43)$$

Here, the first term calculates the minimum path metric among the path metrics corresponding to the branches where the most prior transmitted signals $I_{n-4}$ among transmission sequences $I_{n-4}$, $I_{n-3}$, $I_{n-2}$, $I_{n-1}$ and $I_n$ determined by branches $S_{n-1}/S_n$ become 0. The second term calculates the minimum path metric among the path metrics corresponding to the branches where $I_{n-4}$=1.

In the third embodiment, as in the first embodiment, by setting the memory length V of the trellis to be greater than the memory length L of the estimated CIR, the soft-decision with accuracy higher than the conventional example can be achieved. Further, by sharing the branch metric producing circuits outputting the same value, the memory length V of the trellis can be enlarged while suppressing the increment of the circuit scale.

Further, in the third embodiment, as in the second embodiment, by arranging to update the CIR, the softdecision with high accuracy can be achieved even when the variation of the CIR is large.

Further, although the third embodiment sets the number U, which can be taken by the transmitted signal, to 2, it can be easily extended in case of the number greater than 2. It is more practical to use a combination of −1 and 1 rather than 0 and 1 as values which can be taken. Further, it may also be arranged that a value derived by multiplying the square error between the received signal and the replica by −1 is used as a branch metric, so as to select the maximum value instead of the minimum value in the ACS process and the calculation of the soft-decision value.

Fourth Embodiment

The fourth embodiment of the present invention will now be explained. This embodiment of the invention is a structural example wherein the transmitted signal takes a binary digit of 0 or 1. In the figures, those components which are designated by the same reference numerals and/or symbols as those in the foregoing embodiments are the same or corresponding components.

Figure 15:
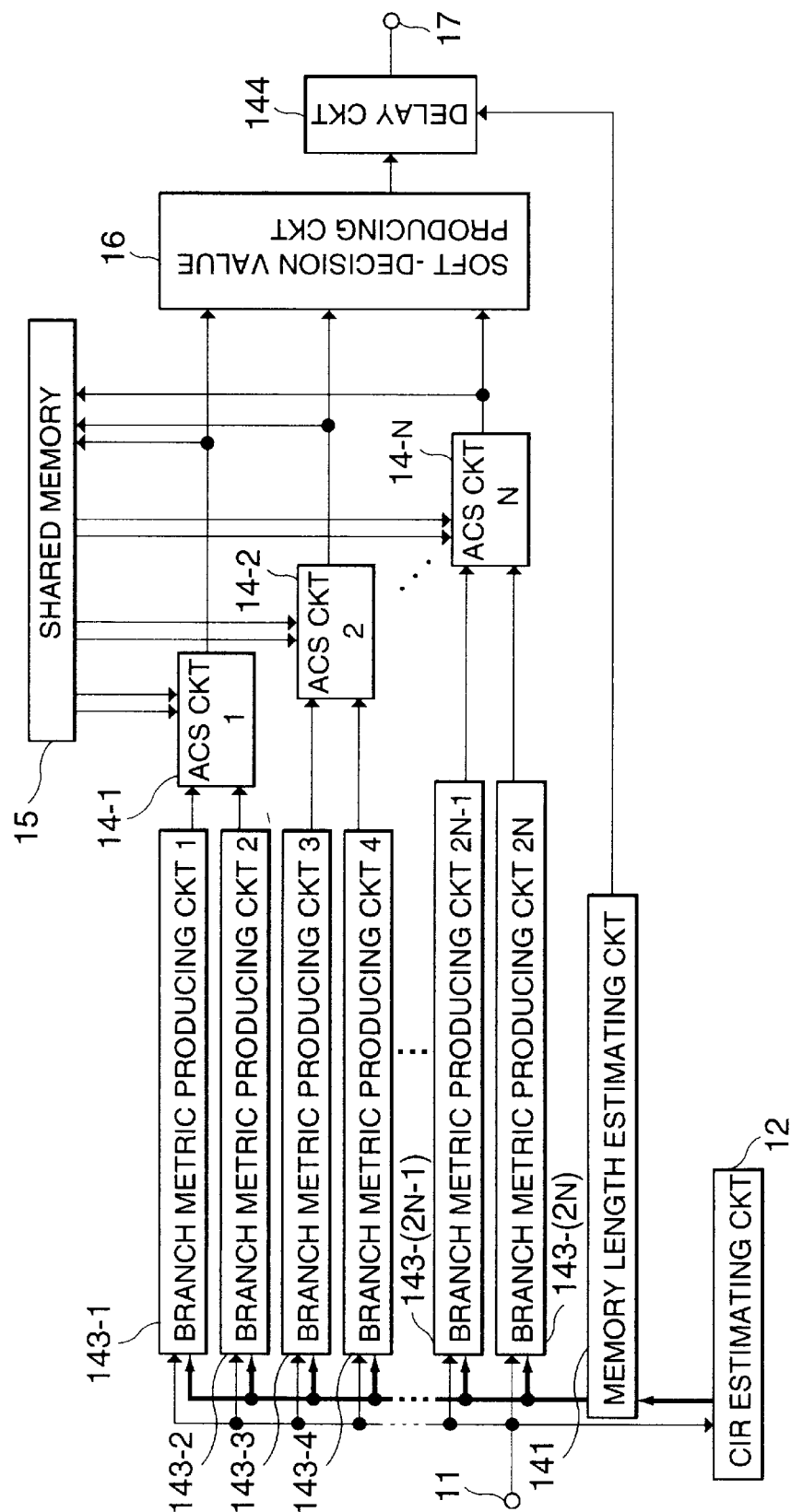
FIG. 15 is a block diagram of a soft-decision device according to a fourth embodiment of the present invention.

FIG. 15 is a block diagram showing the fourth embodiment of the present invention. In the figure, 11 denotes a received signal input terminal, 12 a CIR estimating circuit, 141 a memory length estimating circuit for estimating a memory length of a CIR having the intersymbol interference (ISI) based on estimate values of the CIR provided by the CIR estimating circuit 12, 143-1 . . . 143(2N) branch metric producing circuits provided corresponding to branches as many as 2N, respectively, in the trellis where a memory length is given by V (N=$2^v$, V≧L), 14-1 . . . 14-N ACS circuits provided corresponding to states as many as N (=$2^V$), respectively, in the trellis where the memory length is given by V, 15 a shared memory, 16 a soft-decision value producing circuit, 144 a delay circuit which is controlled by the memory length estimating circuit 141 to delay the soft-decision value depending on a shift amount of the tap coefficient of the FIR filter based on an estimation result of the memory length estimating circuit 141, and 17 a soft-decision value output terminal.

Figure 16:
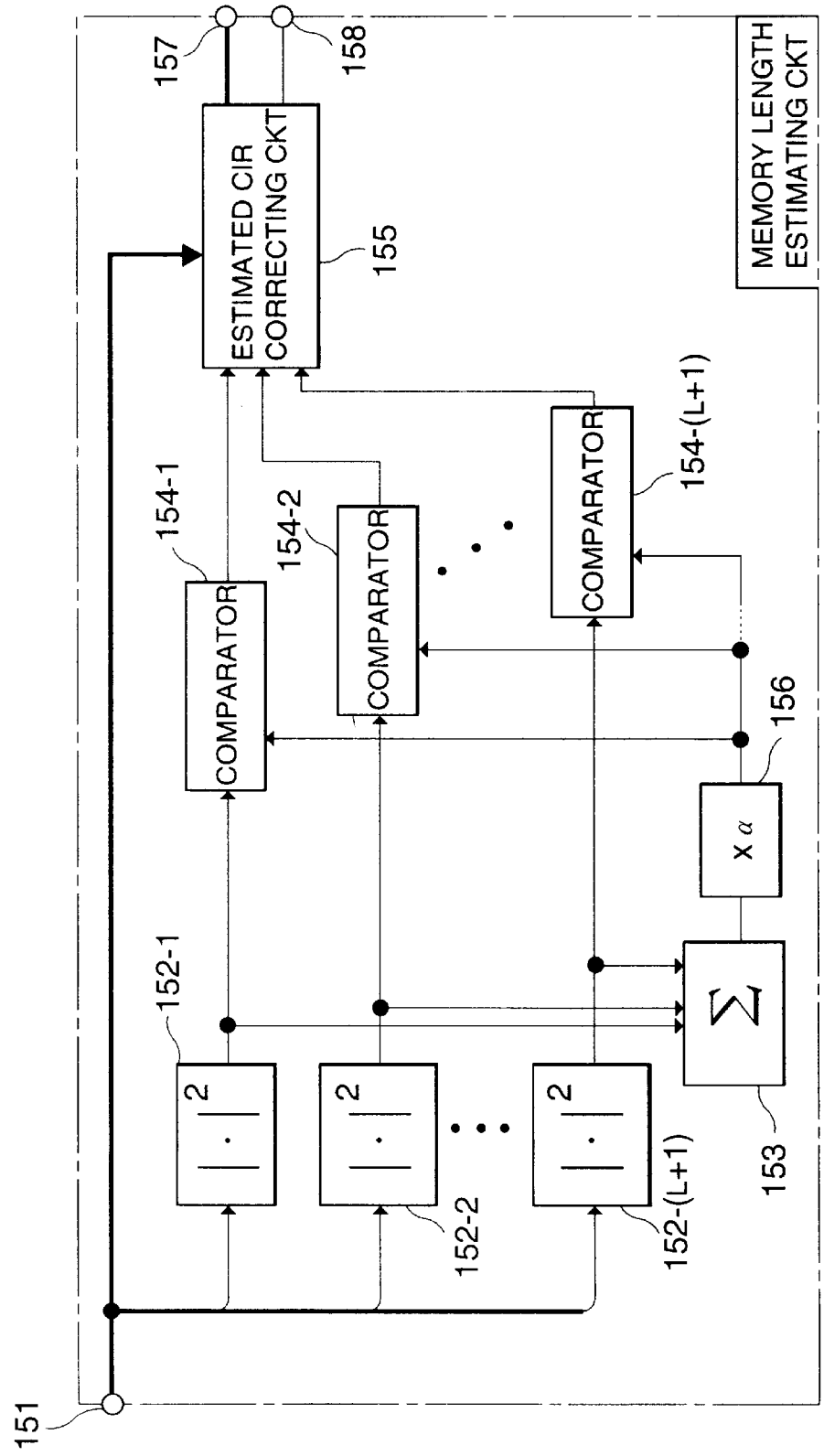
FIG. 16 is a block diagram of a memory length estimating circuit of a soft-decision device according to the fourth embodiment of the present invention.
Figure 17:
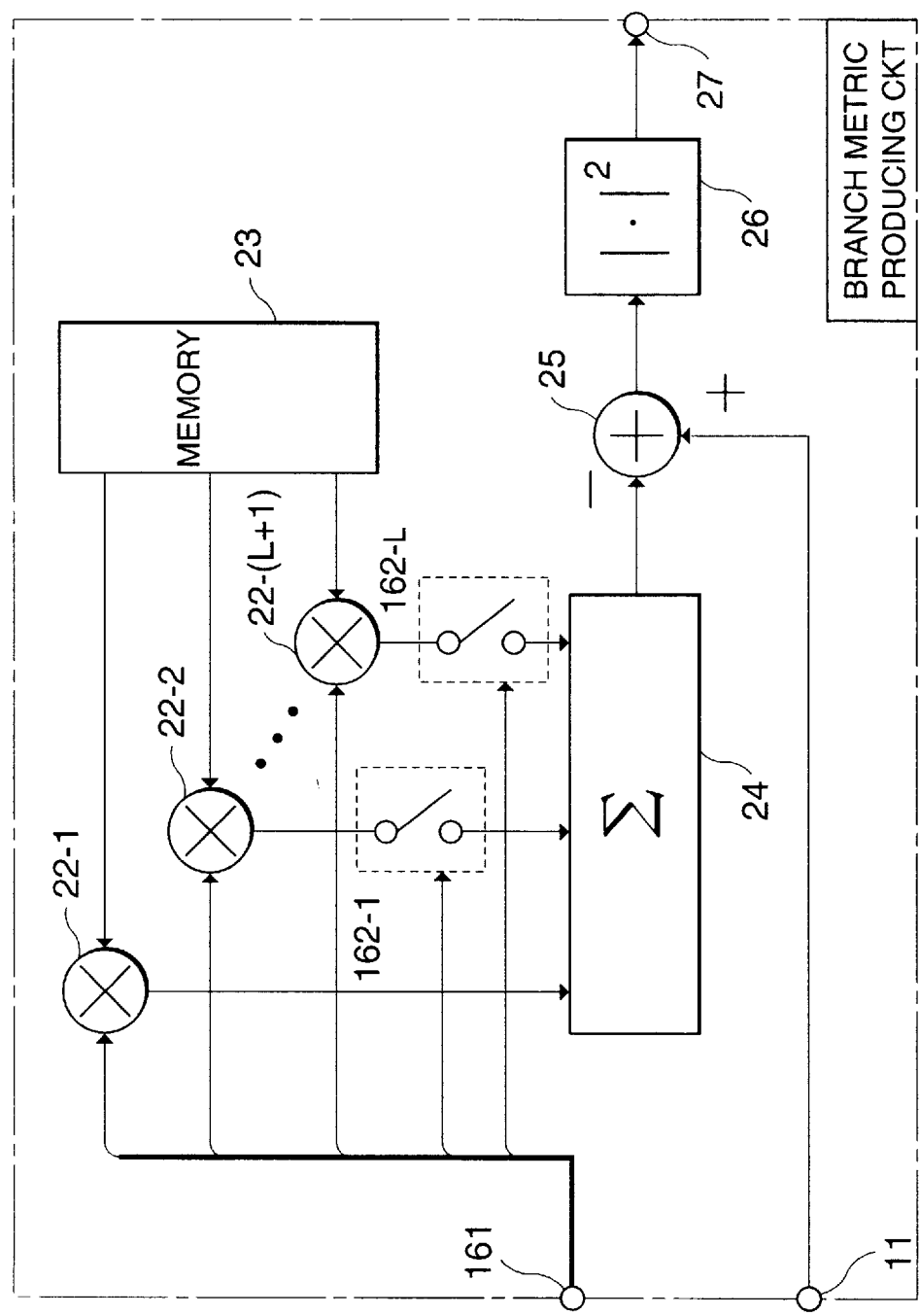
FIG. 17 is a block diagram of a branch metric producing circuit of a soft-decision device according to the fourth embodiment of the present invention.

FIG. 16 is a detailed block diagram of the memory length estimating circuit 141 in FIG. 15. In FIG. 16, 151 represents an estimated CIR input terminal, 152-1 . . . 152-(L+1) square circuits for squaring CIR $g_i$, 153 an adder for deriving the sum of outputs of the square circuits 152-1 . . . 152-(L+1), 156 a multiplier for multiplying an output of the adder 153 by a constant cc to output a threshold Q, 154-1 . . . 154(L+1) comparators for comparing an output of the multiplier 156 and outputs of the square circuits 152-1 . . . 152-(L+1), respectively, 155 an estimated CIR correcting circuit for determining the number of taps so as to include all the tap coefficients $g_i$ which cause the CIR $g_i$ (to be exact, the squares of $g_i$) to be greater than the threshold Q and correcting by shifting the tap coefficients, 157 an estimated CIR output terminal of the CIR, and 158 a decision value delay output terminal for outputting the shift amount of the estimated CIR correcting circuit 155 as a delay. FIG. 17 is a detailed block diagram of the branch metric producing circuit 143-1 in FIG. 15. In FIG. 17, 11 represents a received signal input terminal, 161 an estimated CIR input terminal, 22-1 . . . 22-(L+1) multiplying circuits, 23 a memory, 162-1 . . . 162-L selector switches provided for the multipliers 22-2 . . . 22-(L+1), respectively, for on/off switching the outputs of the multipliers 22-2 . . . 22-(L+1) based on the output of the memory length estimating circuit 141, 24 an adder for deriving the sum of outputs of the multiplier 22-1 and the selector switches 162-1 . . . 162-L, 25 a subtraction circuit, 26 a square circuit, and 27 a branch metric output terminal.

Next, the operation of the soft-decision device of the fourth embodiment will be explained using FIG. 15. The received signal is formed by a training signal for the purpose of estimating the CIR and an information signal for the purpose of transmitting the information. The training signal is assumed to be known at the side of the soft-decision device. Hereinafter, the information signal portion of the received signal will be referred to as the received signal, and the training signal portion of the received signal will be referred to as the training signal.

First, an outline of the operation will be explained, and thereafter, the more detailed process contents will be explained using equations.

The CIR estimating circuit 12 estimates the CIR based on the training signal and the known information of the training signal. The memory length estimating circuit 141 estimates the estimated memory length of the CIR based on the CIR outputted from the CIR estimating circuit 12 and outputs the estimated memory length of the CIR, the estimated CIR including information about the reception, and the delay of the decision value.

The branch metric producing circuits 143-1 . . . 143-(2N) receive the received signal and the estimated CIR including information about the estimated memory length of the CIR outputted from the memory length estimating circuit 141, and output branch metrics based on the transmission sequences corresponding to the branches, respectively.

The ACS circuit 14-1 receives the branch metrics outputted from two lines of the branch metric producing circuits corresponding to two branches connected to the state which corresponds to the ACS circuit 14-1, and one-time prior survivor metrics outputted from the shared memory 15 corresponding to one-time prior states connected by those two branches so as to perform the ACS process and outputs a current-time survivor metric. The other ACS circuits 14-2 . . . 14-N operate similarly.

The shared memory 15 inputs the current-time survivor metrics outputted from the ACS circuits 14-1 . . . 14-N to update the one-time prior survivor metrics.

The soft-decision producing circuit 16 inputs the current-time survivor metrics outputted from the ACS circuits 14-1 . . . 14-N to calculate the soft-decision value and outputs the soft-decision value.

The delay circuit 144 delays the soft-decision value outputted from the softdecision value producing circuit 16 based on the delay of the decision value outputted from the memory length estimating circuit 141. This delayed soft-decision value is outputted from the soft-decision value output terminal 17.

Operation of the memory length estimating circuit 141 will be explained using FIG. 16. The square circuits 152-1 . . . 152-(L+1) calculate the squares of the respective tap coefficients (estimated CIR) outputted from the CIR estimating circuit 12.

The adder 153 calculates the sum of the values outputted from the square circuits 152-1 . . . 152-(L+1).

The multiplier 156 multiplies the sum outputted from the adding circuit 153 by α.

The comparators 154-1 . . . 154-(L+1) compare the values outputted from the square circuits 152-1 . . . 152-(L+1) and the multiplication result outputted from the multiplier 156.

The estimated CIR correcting circuit 155 corrects the estimated CIR based on the estimated CIR received from the estimated CIR input terminal 151 and the comparison results outputted from the comparators 154-1 . . . 154-(L+1), and outputs the correction result (information about the tap coefficients and the number of taps) from the estimated CIR output terminal 156.

Operation of the branch metric producing circuit 143-1 will now be explained using FIG. 17.

The multiplying circuits 22-1 . . . 22-(L+1) calculate the products of the estimated CIR (tap coefficients) received from the estimated CIR input terminal 161 and a portion of the candidates of the transmission sequences determined by the branches corresponding to the branch metric producing circuit 143-1 stored in the memory 23, that is, the (L+1) newer transmitted signals in the (V+1) transmitted signals determined by the branches. The selector switches 162-1 . . . 162-L are controlled by the estimated CIR (the number of taps) outputted from the memory length estimating circuit 142.

The adder 24 receives the multiplication results outputted from the multipliers 22-1 . . . 22-(L+1) via the selector switches 162-1 . . . 162-L and calculates the sum thereof.

The subtraction circuit 25 calculates a difference between the sum outputted from the adder 24 and the received signal inputted from the received signal input terminal 11.

The square circuit 26 calculates the square of the difference outputted from the subtraction circuit 25 and outputs the result via the branch metric output terminal 27 as the branch metric.

Further, the concrete operation of the fourth embodiment will be explained using FIGS. 15 . . . 17. It is given that V=4, L=3, N=$2^V$=16.

In FIG. 16, the comparing circuits 154-1 . . . 154-4 receive the tap coefficients (estimated CIR) $g_0$, $g_1$, $g_2$, $g_3$ and compare the threshold Q and the squares of the absolute values of the tap coefficients $g_i$ (i=0, 1, 2, 3) in the following equation (44):

$$Q = \alpha[\{ABS(g_0)\}^2 + \{ABS(g_1)\}^2 + \{ABS(g_2)\}^2 + \{ABS(g_3)\}^2] \quad (44)$$

The estimated CIR correcting circuit 155 determines the number of taps so that the tap coefficients $g_i$ which cause $\{ABS(g_i)\}^2 > Q$ are all included, and shifts the tap coefficients to prevent $\{ABS(g_0)\}^2 \leq Q$. This shift amount becomes the delay of the decision value. The estimated CIR correcting circuit 155 outputs the shifted tap coefficients and the effective number of taps to the branch metric producing circuits 1431 . . . 143-32 as the CIR, and outputs the delay of the decision value to the delay circuit 144.

Figure 18:
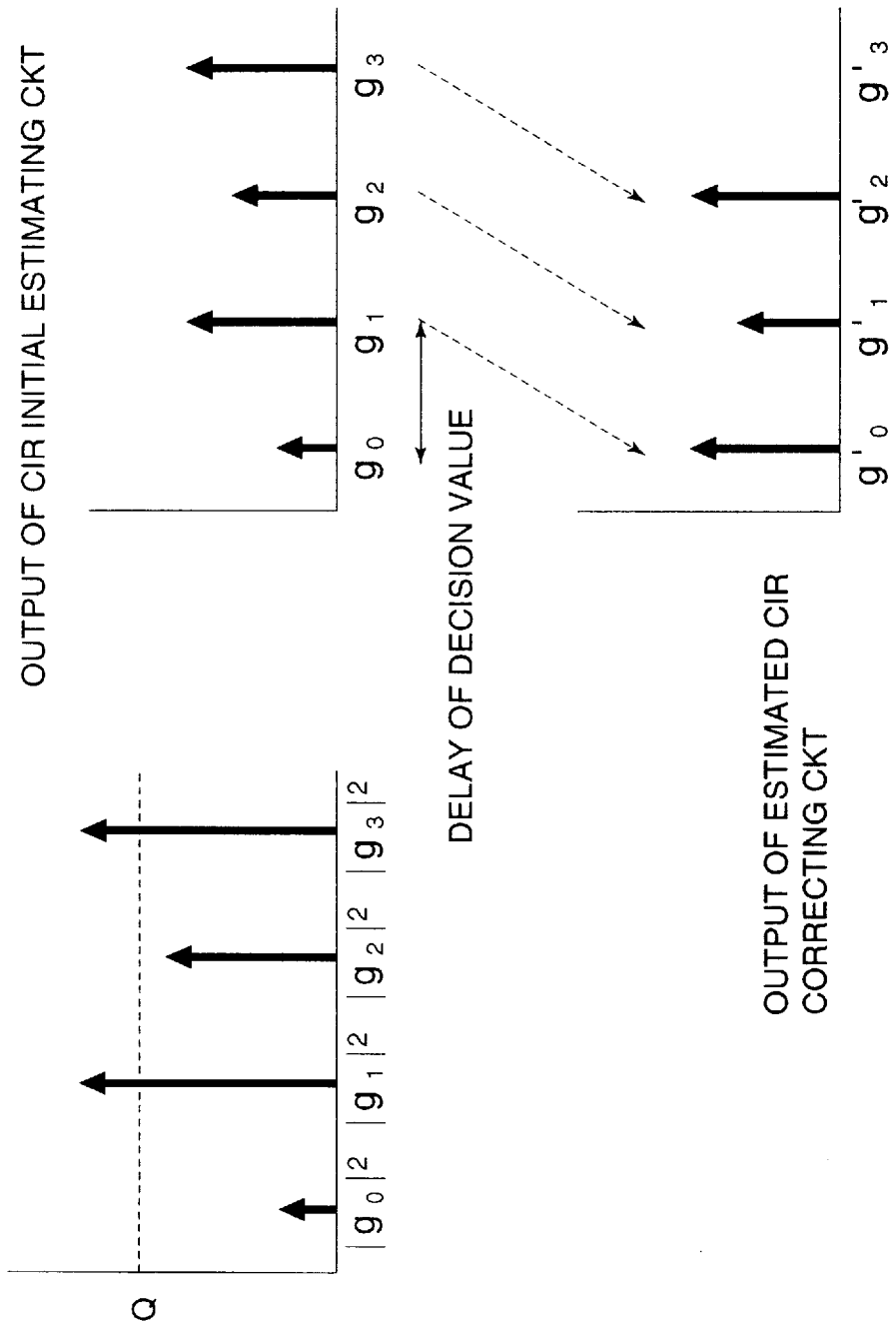
FIG. 18 is an explanatory diagram of a delay operation of a soft-decision value in a memory length estimating circuit of a soft-decision device according to the fourth embodiment of the present invention.

An example of correcting the estimated CIR is shown in FIG. 18. Among the tap coefficients estimated by the CIR estimating circuit 12, $g_1$ and $g_3$ provide $\{ABS(g_i)\}^2 > Q$. Accordingly, $g_1$, $g_2$ and $g_3$ are the effective tap coefficients. For avoiding $\{ABS(g_0)\}^2 \leq Q$, $g_1$, $g_2$ and $g_3$ are shifted to $g'_0$, $g'_1$, and $g'_2$, respectively. At this time, since the tap coefficients are shifted by one symbol, the delay of the decision value becomes one symbol.

The branch metric producing circuits 143-1 . . . 143-32 are provided corresponding to branches $S_{n-1}/S_n$, respectively. These branch metric producing circuits 143 receive received signal $r_n$, tap coefficients $g'_0$, $g'_1$, $g'_2$ and $g'_3$ and the effective number of taps (L+1) and calculate the branch metrics from equation (45) based on candidates $I_{n-3}$, $I_{n-2}$, $I_{n-1}$ and $I_n$ held at the branch metric producing circuits 143:

$$E_n[S_{n-1}/S_n] = \{ABS(r_n - \Sigma g'_i I_{n-1})\}^2 \quad (45)$$

wherein the sum $\Sigma$ is derived for i=0, . . . , L.

The ACS circuits 14-1 . . . 14-N, the shared memory 15 and the soft-decision value producing circuit operate similarly as in the foregoing other embodiments.

The delay circuit 144 delays soft-decision value $y_n$ by a shift amount of the tap coefficient in the memory length estimating circuit 141. Although candidates $I_{n-3}$, $I_{n-2}$, $I_{n-1}$ and $I_n$ of the transmitted signals held at the branch metric producing circuits 143 become $I_{n-D-3}$, $I_{n-D-2}$, $I_{n-D-1}$ and $I_{n-D}$ depending on the shift amount, since this sequence is constant free of time, time (n−D) is handled as time n in the foregoing explanation.

In the soft-decision device of the fourth embodiment, by changing the memory length L of the CIR, it is possible to follow even when the memory length of the actual CIR varies so that the soft-decision value with high accuracy can be achieved.

In the fourth embodiment, the memory length estimating circuit 141 estimates the memory length L of the CIR. On the other hand, by estimating also the memory length V of the trellis similarly and stopping an unnecessary ACS circuit based on this estimation value, the mean process volume of the device can be reduced.

Further, in the soft-decision device of the fourth embodiment, by stopping the branch metric producing circuit outputting the same value based on the estimated memory length of the CIR as in the third embodiment, the mean process volume of the device can be reduced.

Further, in the estimated CIR correcting circuit 155, it may be arranged to correct the estimated CIR so as to forcibly set the tap coefficient, which causes $\{ABS(g'_i)\}^2 \leq Q$, to $g_i=0$. For example, since $\{ABS(g'_1)\}^2 \leq Q$ in the output of the estimated CIR correcting circuit 155 in FIG. 16, $g'_i=0$ is set.

Further, in the estimated CIR correcting circuit 155, by setting non-effective tap coefficients (tap coefficients causing $\{ABS(g'_i)\}^2 \leq Q$) to 0, the selector switches in the branch metric producing circuits 143-1 . . . 143(2N) can be omitted.

Further, in the soft-decision device of the fourth embodiment, as in the second embodiment, by arranging to update the estimated CIR recursively, even when the variation of the CIR is large, it is possible to track this so as to achieve a soft-decision with high accuracy.

Further, although the soft-decision device of the fourth embodiment 4 sets the number U, which can be taken by the transmitted signal, to 2, it can be easily extended in case of the number greater than 2. It is more practical to use a combination of −1 and 1 rather than 0 and 1 as values which can be taken. Further, it may also be arranged that a value derived by multiplying the square of error between the received signal and the replica by −1 is used as a branch metric, so as to select the maximum value instead of the minimum value in the ACS process and the calculation of the soft-decision value.

Fifth Embodiment

The fifth embodiment of the present invention will now be explained. This embodiment of the invention is a structural example wherein the transmitted signal takes a binary digit of 0 or 1. In the figures, those components which are assigned the same reference numerals and/or symbols as those in the foregoing embodiments are the same or corresponding components.

Figure 19:
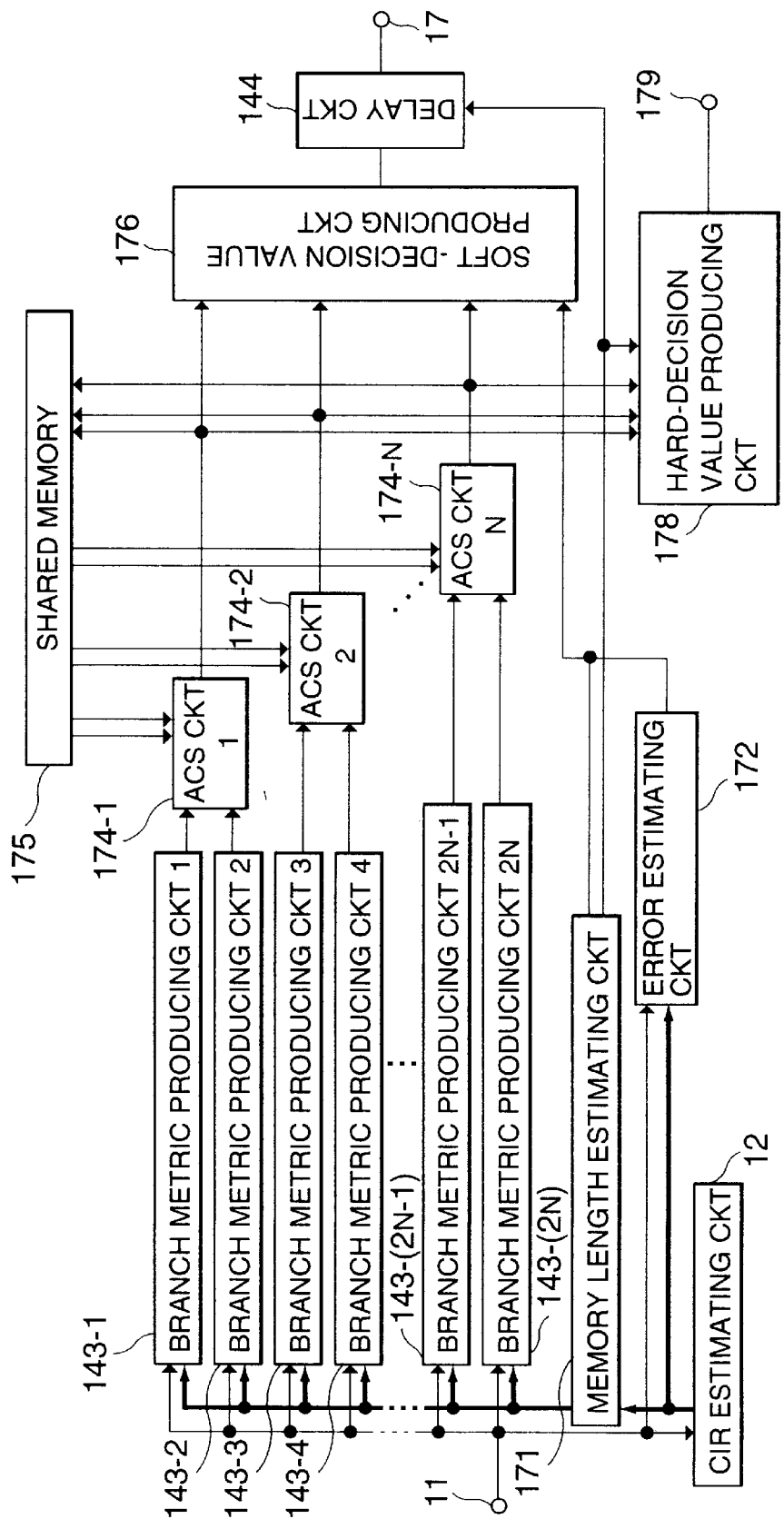
FIG. 19 is a block diagram of a soft-decision device according to a fifth embodiment of the present invention.

FIG. 19 is a block diagram showing the embodiment of a soft-decision device of the present invention. In FIG. 19, 11 denotes a received signal input terminal, 12 a CIR estimating circuit, 143-1 . . . 143-(2N) branch metric producing circuits provided corresponding to as many as (2N branches), respectively, in the trellis where a memory length is given by V (N=$2^V$, V≧T), 171 a memory length estimating circuit, 172 an error estimating detecting circuit for estimating an error based on the CIR from the CIR estimating circuit 12 and the received signal from the received signal input terminal 11 and outputs an estimated error to the memory length estimating circuit 171 and a soft-decision value producing circuit 176, 174-1 . . . 174-N ACS circuits provided corresponding to as many as N (=$2^V$) states, respectively, in the trellis diagram where the memory length is given by V, 175 a shared memory, 176 the soft-decision value producing circuit, 144 a delay circuit, 17 a soft-decision value output terminal, 178 a hard-decision value producing circuit and 179 a hard-decision value output terminal.

Figure 20:
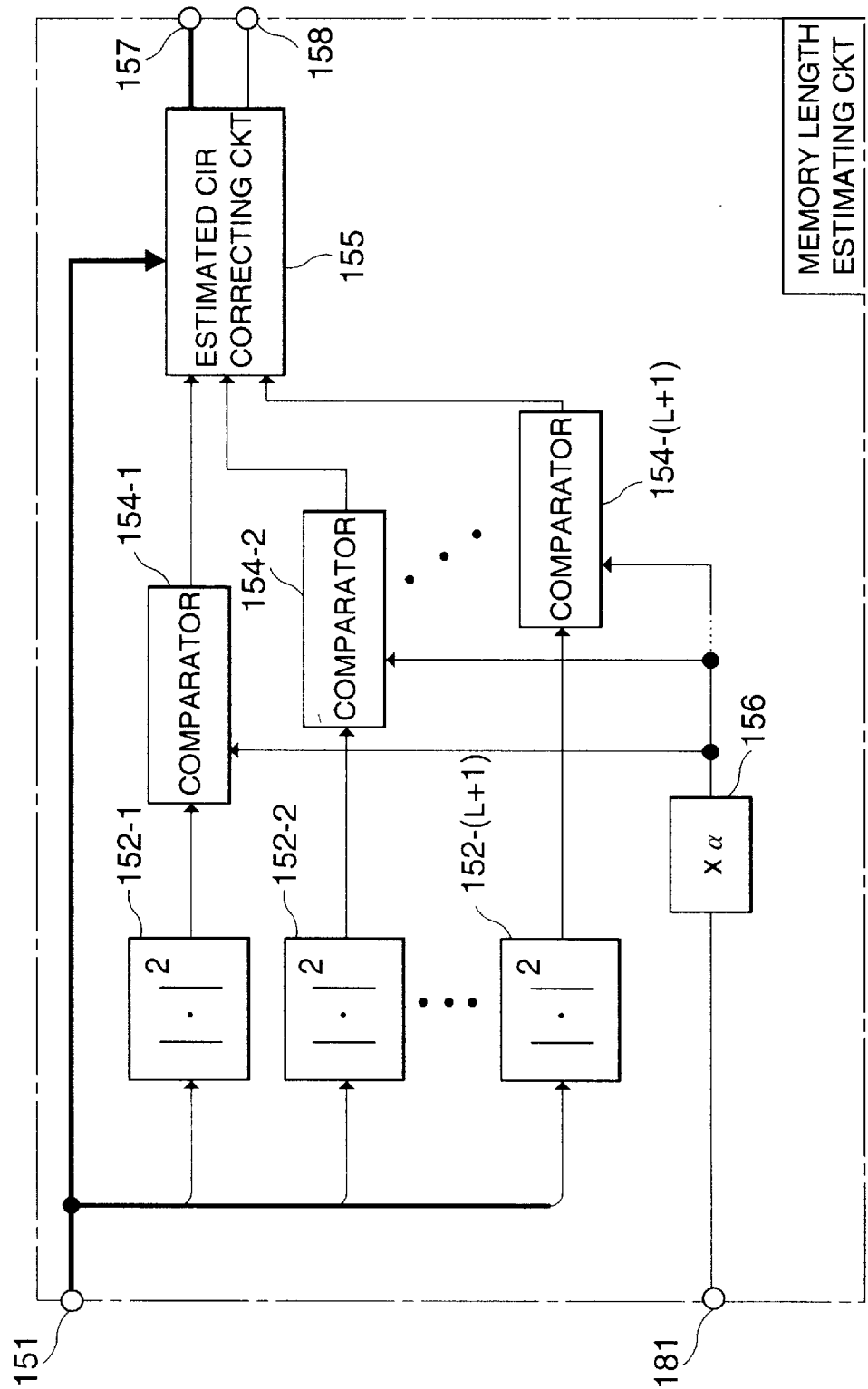
FIG. 20 is a block diagram of a memory length estimating circuit of a soft-decision device according to the fifth embodiment of the present invention.

FIG. 20 is a detailed block diagram of the memory length estimating circuit 171 in FIG. 19. In FIG. 20, 151 represents an estimated CIR input terminal, 152-1 . . . 152-(L+1) square circuits for squaring the estimated CIR, respectively, 154-1 . . . 154-(L+1) comparators for comparing outputs of the square circuits 152-1 . . . 152-(L+1) and an output of a multiplier 156, respectively, 155 an estimated CIR correcting circuit for correcting the CIR based on outputs of the comparators 154-1 . . . 154-(L+1) and the estimated CIR, 156 the multiplier for multiplying the estimated error power from an estimated error power input terminal 181 by a constant α, 157 an estimated CIR output terminal connected to the estimated CIR correcting circuit 155, 158 a decision value delay output terminal connected to the estimated CIR correcting circuit 155, and 181 the estimated error power input terminal for receiving the estimated error power from the error estimating circuit 172.

Figure 21:
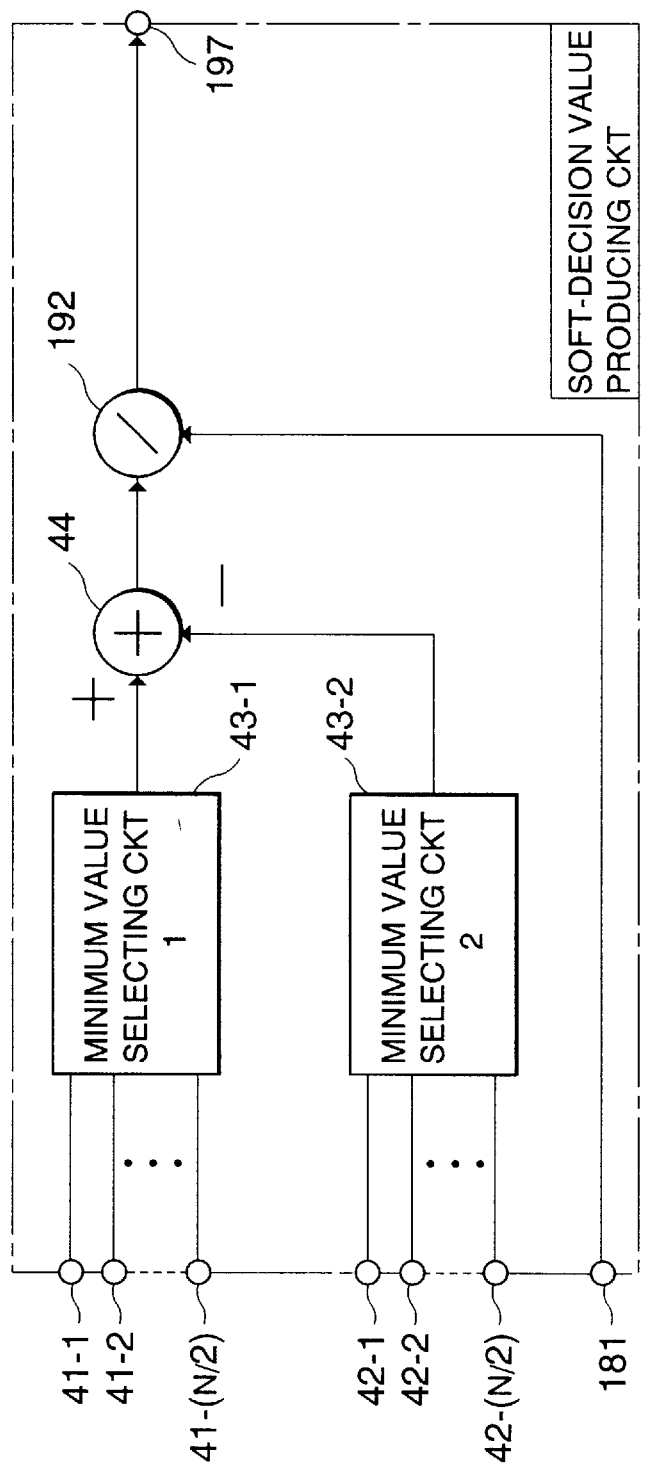
FIG. 21 is a block diagram of a soft-decision value producing circuit of a soft-decision device according to the fifth embodiment of the present invention.
Figure 22:
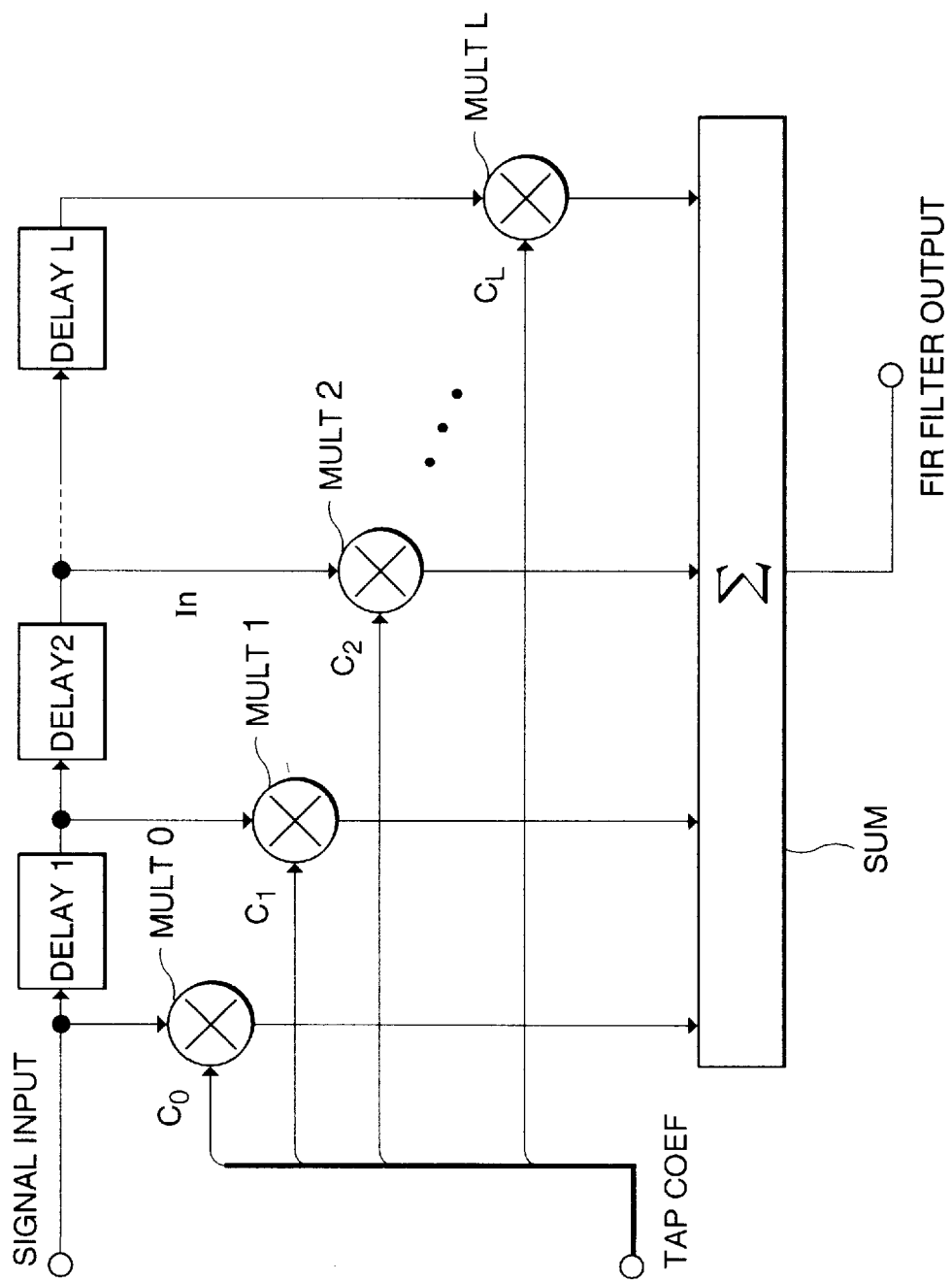
FIG. 22 is a block diagram of an FIR filter.
Figure 23:
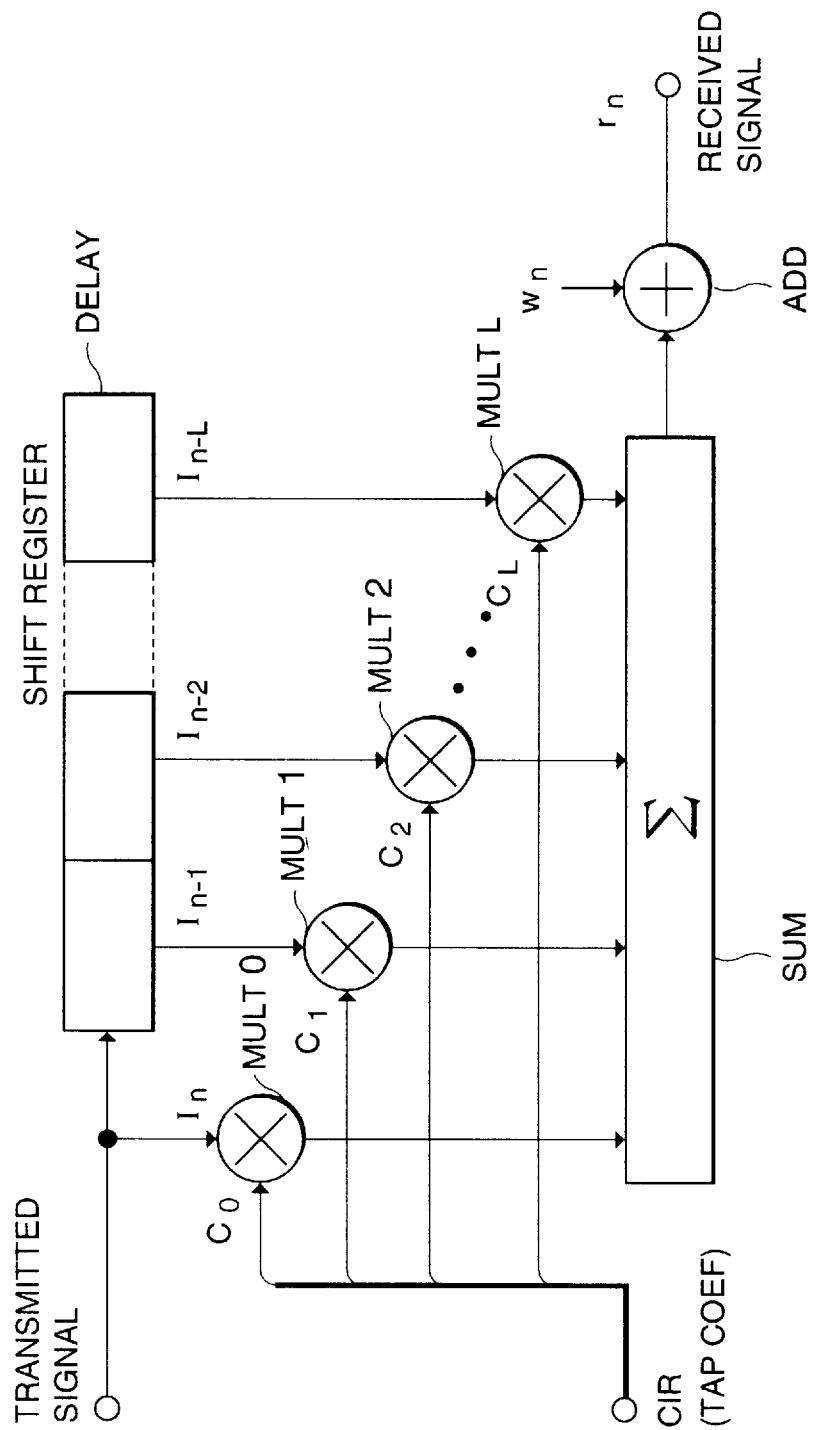
FIG. 23 is a diagram of a channel model.
Figure 24:
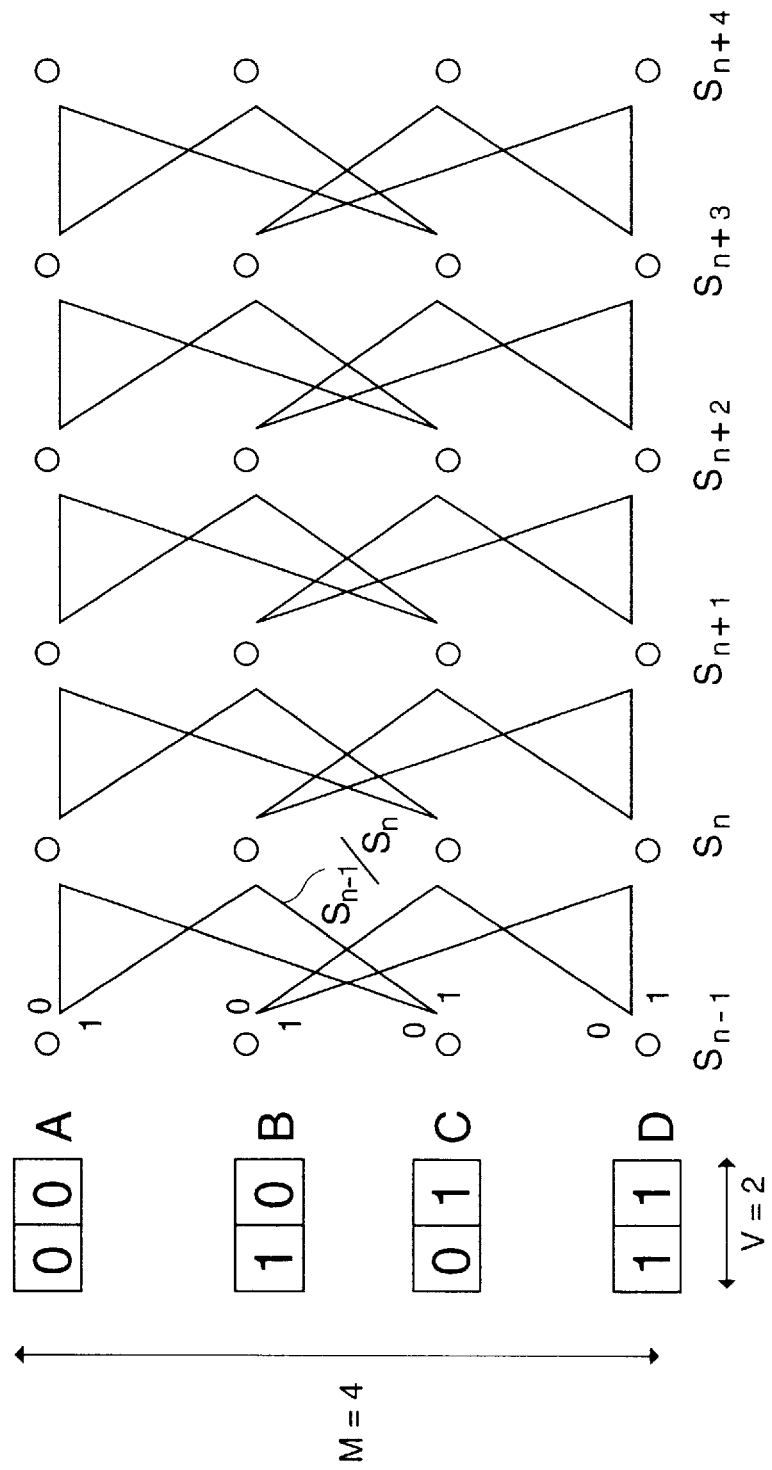
FIG. 24 is a trellis diagram when V=2.
Figure 25:
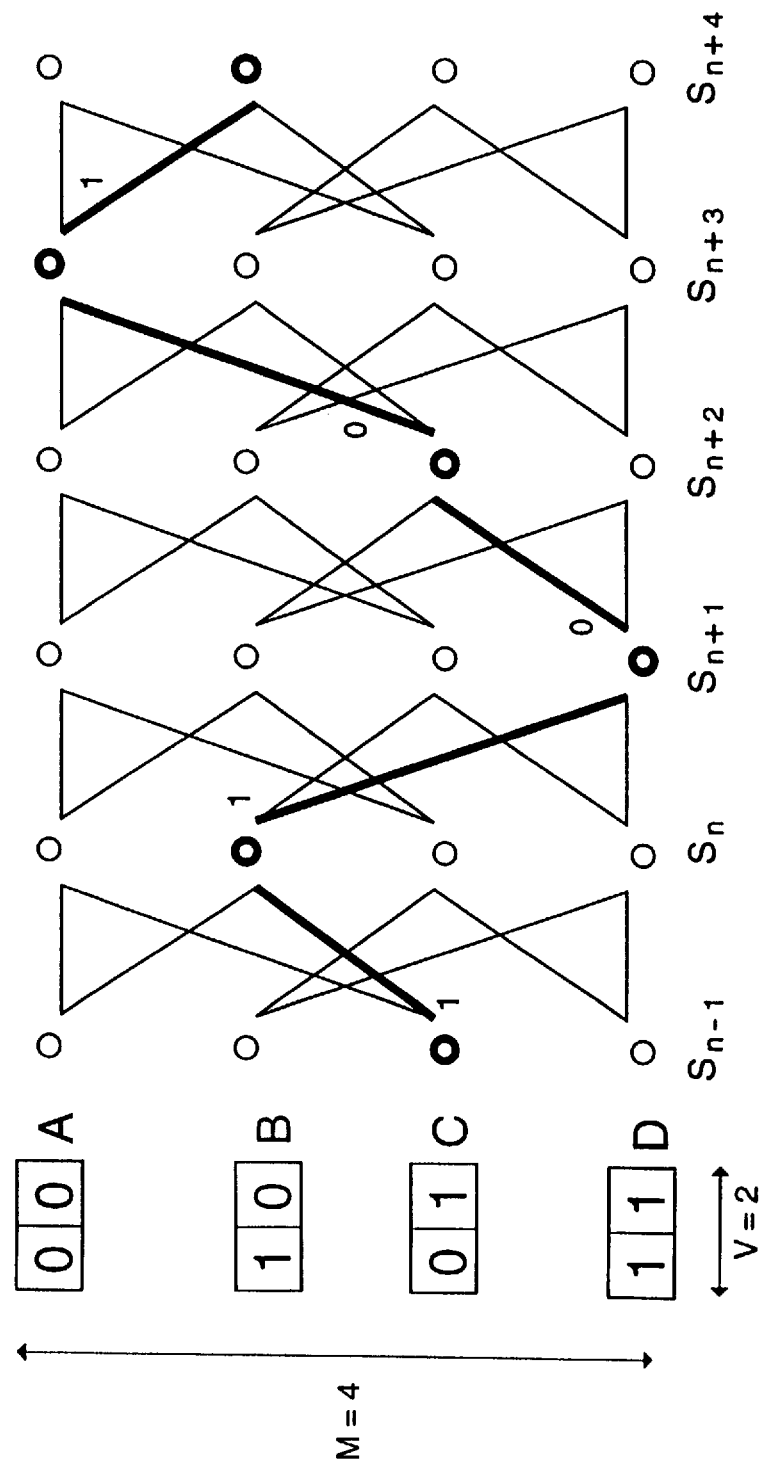
FIG. 25 is a trellis diagram for explaining a conventional maximum-likelihood sequence estimation, wherein V=2.
Figure 26:
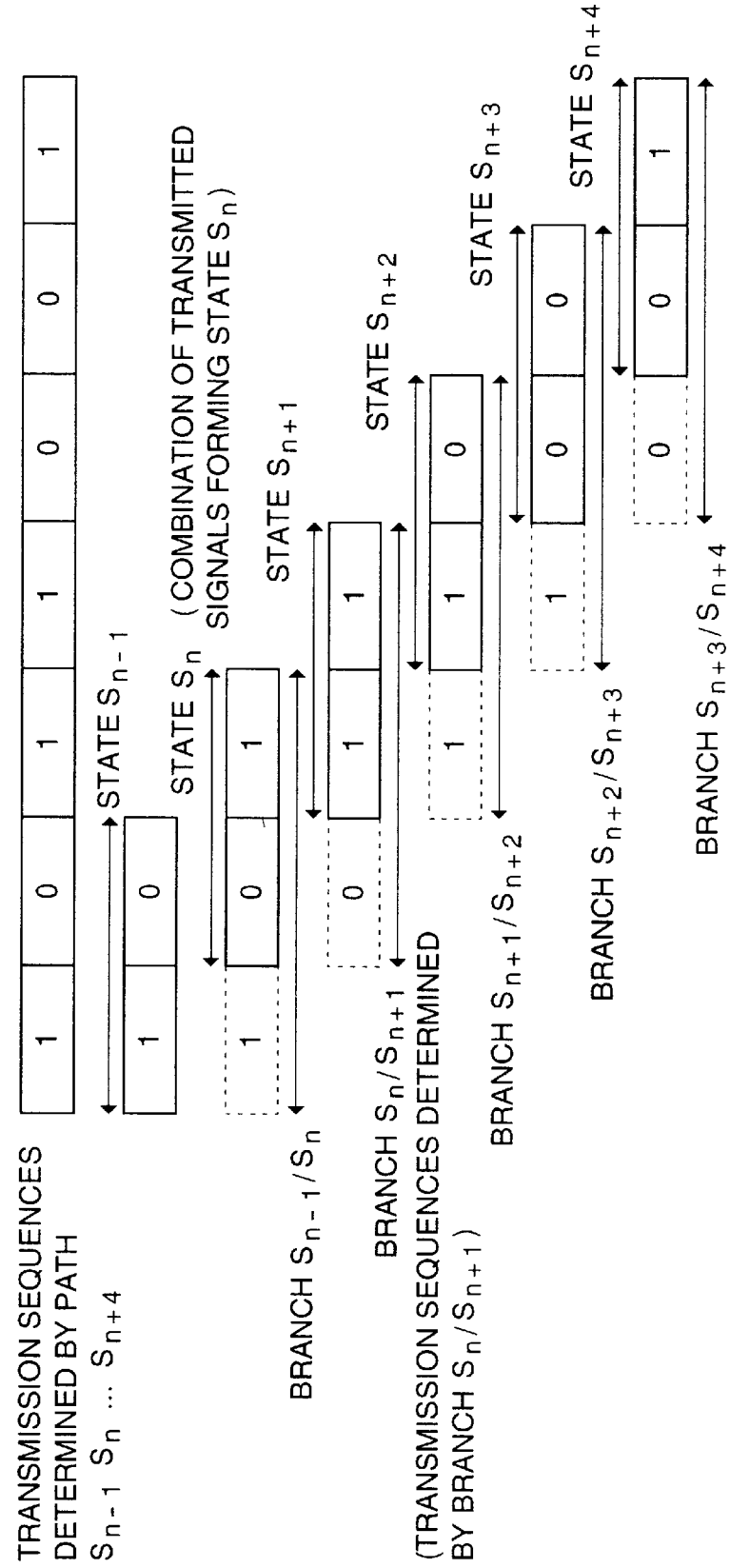
FIG. 26 is an explanatory diagram of a state transition corresponding to the trellis diagram of FIG. 25.
Figure 27:
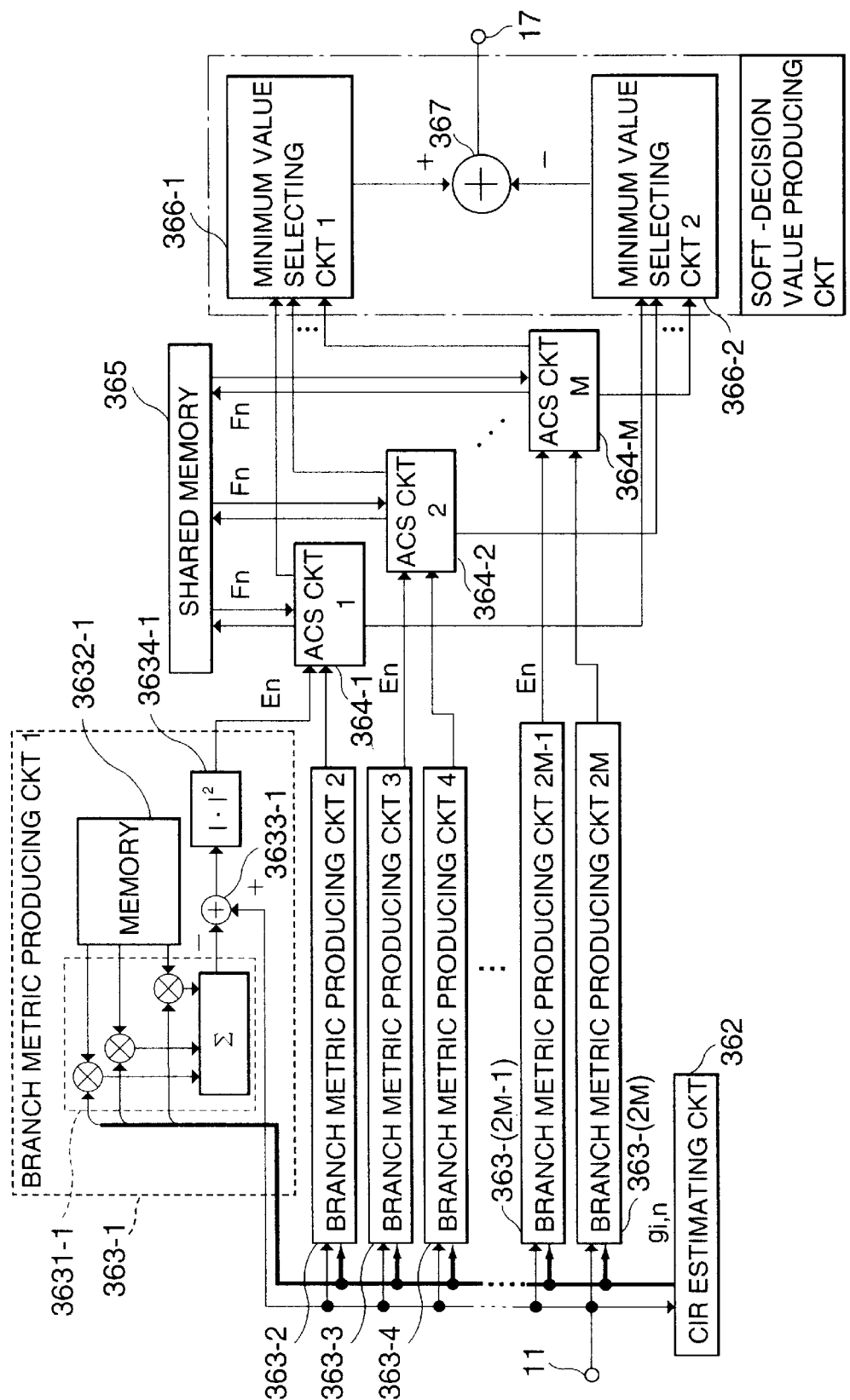
FIG. 27 is a block diagram of a conventional soft-decision device.
Figure 28:
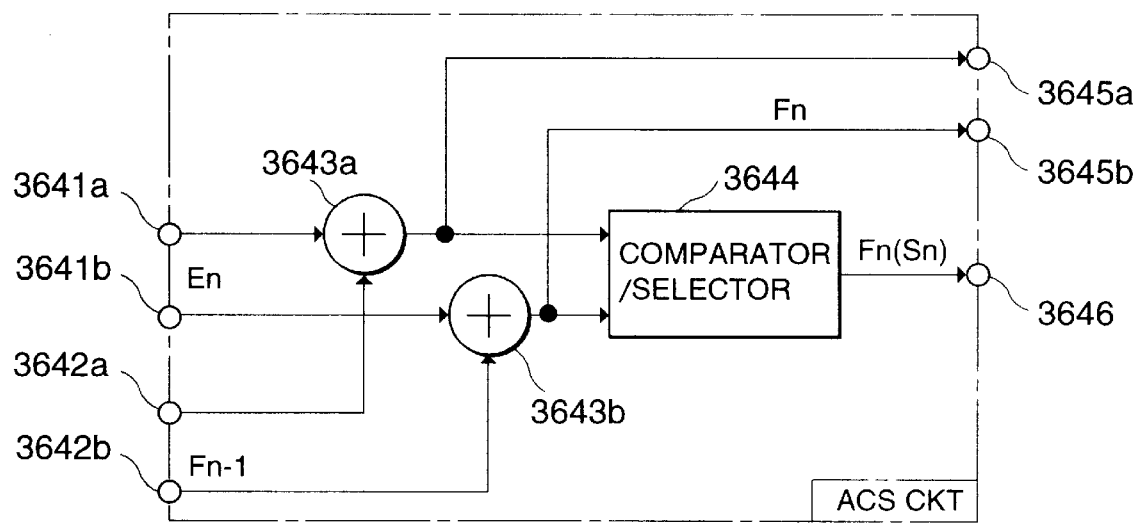
FIG. 28 is a block diagram of an ACS circuit of the conventional soft-decision device.
Figure 29:
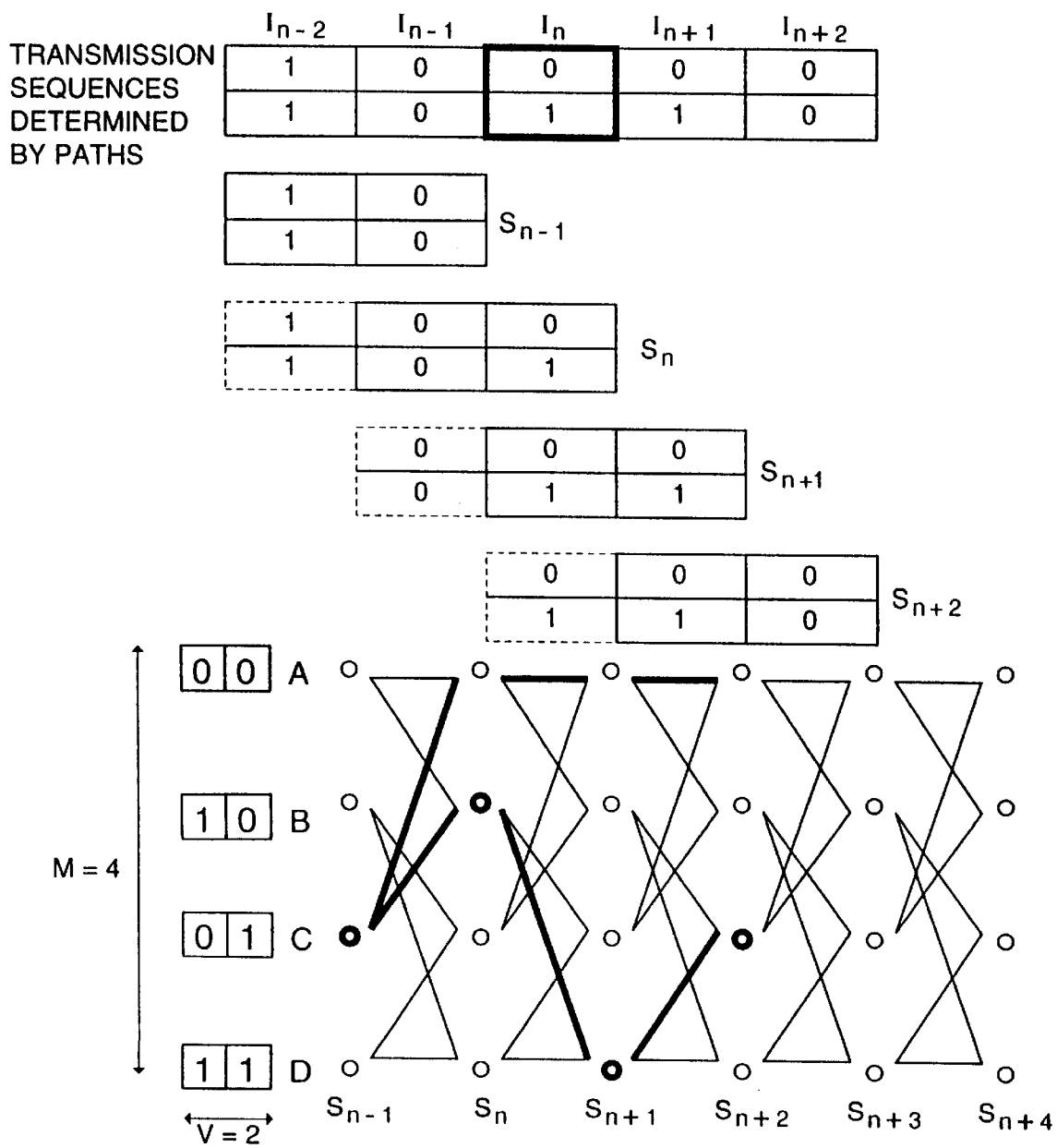
FIG. 29 is a trellis diagram and a state transition diagram for explaining the principle of the conventional soft-decision device, wherein V=2.

FIG. 21 is a detailed block diagram of the soft-decision value producing circuit 176 in FIG. 19. In FIG. 21, 41-1 . . . 41-(N/2) and 42-1 . . . 42-(N/2) denote survivor metric input terminals, 43-1 and 43-2 minimum value selecting circuits, 44 a subtraction circuit, 181 the estimated error power input terminal, 192 a division circuit for dividing the output of the subtraction circuit 44 by the estimated error power value from the terminal 181 so as to output soft-decision value $y_n$, and 197 a decision value output terminal connected to the division circuit 192.

Next, the operation of the soft-decision device of the fifth embodiment will be explained using FIG. 18. The received signal is formed by a training signal for the purpose of estimating the CIR and an information signal for the purpose of transmitting the information. The training signal is assumed to be known at the side of the soft-decision device. Hereinafter, the information signal portion of the received signal will be referred to as the received signal, and the training signal portion of the received signal will be referred to as the training signal.

The CIR estimating circuit 12 estimates the CIR based on the training signal and the known information of the training signal.

The error estimating circuit 172 receives the received signal and the estimated CIR outputted from the CIR estimating circuit 12 to estimate the estimated error power and outputs its estimation value.

The memory length estimating circuit 171 receives the CIR outputted from the CIR estimating circuit 12 and the estimated error power outputted from the error estimating circuit 172 to estimate the memory length of the CIR and outputs the estimated CIR including information about the estimated memory length of the CIR and the delay of the decision value.

The branch metric producing circuits 173-1 . . . 173-(2N) receive the received signal and the estimated CIR including information about the memory length of the estimated CIR outputted from the memory length estimating circuit 171, and output branch metrics based on the transmission sequences corresponding to the branches, respectively.

The ACS circuit 174-1 receives the branch metrics outputted from two branch metric producing circuits corresponding to two branches connected to the state which corresponds to the ACS circuit 174-1, and one-time prior survivors and survivor metrics outputted from the shared memory 175 corresponding to one-time prior states connected by those two branches so as to perform the ACS process and outputs current-time survivor and survivor metric. The other ACS circuits 174-2 . . . 174-N operate similarly.

The shared memory 175 receives the current-time survivors and survivor metrics outputted from the ACS circuits 174-1 . . . 174-N to update the one-time prior survivors and survivor metrics.

The soft-decision producing circuit 176 receives the current-time survivor metrics outputted from the ACS circuits 174-1 . . . 174-N and the estimated error power outputted from the error estimating circuit 172 to perform the soft decision and outputs the soft-decision value.

The delay circuit 144 receives the delay of the decision value outputted from the memory length estimating circuit 171 and the soft-decision value outputted from the soft-decision value producing circuit 176 to delay the soft-decision value by the delay of the decision value, and then outputs it from the soft-decision value output terminal 17.

The hard-decision value producing circuit 178 receives the current-time survivors and survivor metrics outputted from the ACS circuits 1741 . . . 174-N and the delay of the decision value outputted from the memory length estimating circuit 171 and outputs the hard-decision value from the hard-decision value output terminal 179 while estimating the ransmission sequences in consideration of the delay of the decision value.

Operation of the memory length estimating circuit 171 will now be explained using FIG. 20. The square circuits 152-1 . . . 152-(L+1) calculate the squares of the tap coefficients (estimated CIR) outputted from the CIR estimating circuit 12.

The multiplier 156 multiplies the estimated error power inputted from the estimated error power input terminal 181 by α.

The comparators 154-1 . . . 154-(L+1) compare the values outputted from the square circuits 152-1 . . . 152-(L+1) and the multiplication result outputted from the multiplier 156.

The estimated CIR correcting circuit 155 performs correction of the estimated CIR based on the estimated CIR inputted from the estimated CIR input terminal 151 and the comparison results outputted from the comparators 154-1 . . . 154-(L+1), and outputs the correction result (information about the tap coefficients and the number of taps) from the estimated CIR output terminal 157.

Operation of the soft-decision producing circuit 176 will now be explained using FIG. 21. The survivor metric input terminals 41-1 . . . 41-(N/2) receive the survivor metrics outputted from the ACS circuits corresponding to the states where the most prior transmitted signals forming the states are 0. On the other hand, the survivor metric input terminals 42-1 . . . 42-(N/2) receive the survivors outputted from the ACS circuits corresponding to the states where the most prior transmitted signals forming the states are 1.

The minimum value selecting circuit 43-1 receives the survivor metrics from the survivor metric input terminals 41-1 . . . 41-(N/2) and outputs the minimum survivor metric among them. The minimum value selecting circuit 43-2 receives the survivor metrics from the survivor metric input terminals 42-1 . . . 42-(N/2) and outputs the minimum survivor metric among them.

The subtraction circuit 44 subtracts the output of the minimum value selecting circuit 43-2 from the output of the minimum value selecting circuit 43-1.

The division circuit 192 divides the value outputted from the subtraction circuit 44 by the estimated error power from the estimated error power input terminal 181 and outputs this calculation result from the soft-decision value output terminal 197 as a soft-decision value.

Further, the specific operation of the fifth embodiment will now be explained. It is given that V=4, L=3 and $N=2^V=16$.

The CIR estimating circuit 12 estimates the tap coefficients (estimated CIR) $g_0$, $g_1$, $g_2$ and $g_3$ based on training signal $r'_n$ and known information $I'_n$ of the training signal.

The error estimating circuit 172 calculates the estimated error power from equation (46):

$$e = \Sigma\{ABS(r'_n - \Sigma g_i I'_{n-i})\}^2/(N-2) \quad (46)$$

wherein the sum $\Sigma$ in brackets is derived for i=0, . . . , 3.
The sum $\Sigma$ outside brackets is derived for n=3, . . . , N.

On the other hand, the estimated error power e represents the mean error power between the actual received signal and the replica of the received signal.

The multiplier 156 multiplies the estimated error power e by $\alpha$ and calculates the threshold Q ($=\alpha \cdot e$). The comparators 154-1 . . . 154-4 compare the threshold Q and the squares of the absolute values of $g_i$, that is, $\{ABS\ (g_i)\}^2$ (i=0, 1, 2, 3), respectively.

The estimated CIR correcting circuit 155 determines the number of taps so that the tap coefficients $g_i$ which cause $\{ABS\ (g_i)\}^2 > Q$ are all included, and shifts the tap coefficients to prevent $\{ABS\ (g_0)\}^2 \leq Q$. This shift amount becomes the delay of the received signal. The estimated CIR correcting circuit 155 outputs the shifted tap coefficients, the effective number of taps to the branch metric producing circuits 143-1 . . . 143-32 as the estimated CIRs and outputs the delay of the received signal to the delay circuit 144 as the delay of the decision value.

The hard-decision value producing circuit 178 receives the survivors and the survivor metrics outputted from the ACS circuits 174-1 . . . 174-16 and the delay of the decision value outputted from the memory length estimating circuit 171, determines sequence along the survivor, where the survivor metric becomes minimum, to be the transmitted sequences, and outputs a signal delayed by the delay of the decision value from the hard-decision value output terminal 179 as hard-decision values.

The soft-decision value producing circuit 176 inputs the survivor metrics outputted from the ACS circuits 174-1 . . . 174-16 and calculates soft-decision value $y_{n-3}$ from equation (46):

$$y_{n-3} = \{min(F_n[S_n]) - min(F_n[S_n])\}/e \quad (46)$$

Here, the first term of the numerator calculates the minimum survivor metric among the survivor metrics corresponding to the states where the most prior transmitted signals $I_{n-3}$ among the transmission sequences $I_{n-3}$, $I_{n-2}$, $I_{n-1}$ and $I_n$ determined by states $S_n$ become 0. The second term of the numerator calculates the minimum survivor metric among the survivor metrics corresponding to the states where $I_{n-3}=1$.

In the soft-decision device of the fifth embodiment, since the soft-decision value is normalized by the estimated error power, even when the noise power changes, the proper soft-decision value can be derived so that a soft decision with high accuracy can be achieved.

Further, in the soft-decision device of the fifth embodiment, by changing the memory length L of the estimated CIR, a soft-decision with high accuracy can be achieved even when the memory length of the actual CIR varies.

Further, in the soft-decision device of the fifth embodiment, the memory length estimating circuit 141 estimates the memory length L of the estimated CIR. On the other hand, by estimating also the memory length V of the trellis similarly and stopping an unnecessary ACS circuit based on this estimation value, the mean process volume of the device can be reduced.

Further, in the soft-decision device of the fifth embodiment, by stopping the branch metric producing circuit outputting the same value based on the estimated memory length of the CIR as in the third embodiment, the mean process volume of the device can be reduced.

Further, in the soft-decision device of the fifth embodiment, as in the second embodiment, by arranging to update the estimated CIR recursively, even when the variation of the CIR is large, the soft-decision with high accuracy can be achieved.

Further, although the soft-decision device of the fifth embodiment sets the number U, which can be taken by the transmitted signal, to 2, it can be easily extended in case of the number greater than 2. It is more practical to use a combination of −1 and 1 rather than 0 and 1 as values which can be taken. Further, it may also be arranged that a value derived by multiplying the square error between the received signal and the replica by −1 is used as a branch metric, so as to select the maximum value instead of the minimum value in the ACS process and the calculation of the soft-decision value.

The hard-decision value calculated from the soft-decision value is impaired in error rate as compared with the hard-decision value determined through the maximum-likelihood sequence estimation. Accordingly, in the system where convolutionally encoded data and non-encoded data are transmitted in combination, if the hard-decision value is calculated from the result of the soft decision, the error rate of the non-encoded signal is impaired. In the soft-decision device in the fifth embodiment, since the hard decision based on the maximum-likelihood sequence estimation is performed simultaneously with the soft-decision, the error rate of the non-encoded signal can be improved in the foregoing system.

What is claimed is:

1. A receiver for receiving encoded data signals via a channel causing intersymbol interference, wherein transmission conditions of the received signals correspond to different states; transitions from certain states to next states correspond to branch metrics as indices of said transitions; path metrics based on said branch metrics are derived as indices of paths through adjacent states, said paths representing transitions of a received encoded data sequence;

a soft decision is performed on said received signals by selecting portions of said paths as current survivor states based on said path metrics; and decoding is performed using a result of said soft decision, said receiver comprising:

a soft-decision device for deriving from said branch metrics survivor metrics corresponding to said current survivor states, said soft-decision device classifying said survivor metrics according to the values of prior survivor states corresponding to prior states leading to said current survivor states so as to derive a soft-decision value based on all of said classified survivor metrics; and a decoding circuit for performing decoding based on said soft-decision value.

2. The receiver according to claim 1, wherein said soft-decision device comprises:

CIR estimating means for estimating a memory length L and CIR of said channel based on said received signals received via the channel;

branch metric producing means for causing combinations of V(V≧L) consecutive transmitted signals to correspond to said states, and deriving said branch metrics of respective branches connected to each of said states based on said received signal and said CIR estimated by said CIR estimating means;

ACS means for receiving said branch metrics outputted from said branch metric producing means and one-time prior survivor metrics to derive the path metric of said survivor per state and outputting it as said survivor metric;

a memory for storing said survivor metrics and outputting them as said one-time prior survivor metrics when said ACS means performs a next process;

first minimum value selecting means for receiving said survivor metric per state from said ACS means, and for selecting, from said survivor metrics, those survivor metrics where most prior transmitted signals in the states represent a first symbol, and outputting minimum one among said selected surviving path metrics;

second minimum value selecting means for receiving said survivor metric per state from said ACS means, selecting, from said survivor metrics, those survivor metrics where most prior transmitted signals in the states represent a second symbol, and outputting a minimum one among said selected survivor metrics; and soft-decision value producing means for outputting a soft-decision value based on he minimum survivor metrics outputted by said first and second minimum value selecting eans, respectively.

3. The receiver according to claim 2, wherein said branch metric producing means derives said branch metric based on the following equation:

$$E_n[S_{n-1}/S_n] = [ABS \{r_n - (g_0 I_n + g_1 I_{n-1} + g_2 I_{n-2})\}]^2$$

wherein $E_n [S_{n-1}/S_n]$ represents the branch metric, $r_n$ represents the received signal, $g_0 \ldots g_2$ represent the estimated CIR, and $I_n \ldots I_{n-2}$ represent candidates of the transmitted signals per branch held by said branch metric producing means.

4. The receiver according to claim 2, wherein said ACS means selects and outputs smaller one of the path metrics $F_n [S^0_{n-1}/S_n]$ and $F_n [S^1_{n-1}/S_n]$ per state as the survivor metric, and wherein said path metrics are derived based on the following equations:

$$F_n[S^0_{n-1}/S_n] = E_n[S^0_{n-1}/S_n] + F_{n-1}[S^0_{n-1}]$$

$$F_n[S^1_{n-1}/S_n] = E_n[S^1_{n-1}/S_n] + F_{n-1}[S^1_{n-1}]$$

wherein $E_n [S^0_{n-1}/S_n]$ and $E_n [S^1_{n-1}/S_n]$ represent the branch metrics, $F_{n-1} [S^0_{n-1}]$ and $F_{n-1} [S^1_{n-1}]$ represent the one-time prior survivor metrics, $S^0_{n-1}/S_n$ represents a "0" branch connected to state $S_n$, and $S^1_{n-1}/S_n$ represents a "1" branch connected to state $S_n$.

5. The receiver according to claim 2, wherein said soft decision value producing means derives said soft-decision value based on the following equation:

$$y_{n-3} = min_0(F_n[S_n]) - min_1(F_n[S_n])$$

wherein $y_{n-3}$ represents the soft-decision value, $min_0(F_n [S_n])$ represents an output of the first minimum value selecting means, and $min_1 (F_n [S_n])$ represents an output of the second minimum value selecting means.

6. The receiver according to claim 2, wherein said ACS means outputs said survivor metrics and the corresponding survivors, and further comprising hard-decision value producing means for receiving said survivors and said survivor metrics thereof to derive a hard-decision value.

7. The receiver according to claim 2, further comprising:

memory length estimating means for deriving the memory length L of the channel and the number V of the transmitted signals forming the state based on the estimated CIR and estimated memory length L outputted from said CIR estimating means, wherein said branch metric producing means derives said branch metrics based on an output of said memory length estimating means.

8. The receiver according to claim 7, wherein said memory length estimating means derives a signal power and intersymbol interference components based on said estimated CIR, corrects said estimated CIR based on said signal power and said intersymbol interference components, and outputs the estimated CIR after correction and said memory length L to said branch metric producing means, and said number V of the transmitted signals to said ACS means.

9. The receiver according to claim 2, further comprising:

error power estimating means for deriving an estimated error power based on said received signal and said estimated CIR outputted from the CIR estimating means, wherein said soft-decision value producing means corrects said soft decision value based on said estimated error power.

10. The receiver according to claim 2, further comprising CIR updating means for sequentially updating said estimated CIR based on said received signals and said soft-decision values, and outputting the updated CIR to said branch metric producing means.

11. A receiver for receiving encoded data signals via a channel causing intersymbol interference, wherein transmission conditions of the received signals correspond to different states; transitions from certain states to next states correspond to branch metrics as indices of said transitions; path metrics based on said branch metrics are derived as indices of paths through adjacent states, said paths representing transitions of a received encoded data sequence; a soft decision is performed on said received signals by selecting portions of said paths as current survivor states based on said path metrics; and decoding is performed using a result of said soft decision, said receiver comprising:

a soft-decision device which increases the number of said states by setting a data sequence length of the received signals corresponding to said states to be greater than a memory length of the channel, said soft decision device deriving said path metrics per state, determining for each state a current survivor path metric, corresponding to a current survivor path, based on said path metrics per state, classifying said current survivor path metrics according to the values of prior survivor states forming part of said current survivor paths so as to derive a soft-decision value based on all of said classified current survivor path metrics; and a decoding circuit for performing decoding based on said soft-decision value.

12. The receiver according to claim 11, wherein said soft decision device comprises:

CIR estimating means for estimating a memory length L and CIR of said channel based on said received signals received via the channel;

branch metric producing means for causing combinations of V(V≧L) consecutive transmitted signals to correspond to said states, and deriving said branch metrics of respective branches connected to each of said states based on said received signal and said CIR estimated by said CIR estimating means;

ACS means for receiving said branch metrics outputted from said branch metric producing means and one-time prior survivor metrics, and outputting the path metric of said survivor per state and the path metrics of the paths, including all branches connected to the corresponding state;

a memory for storing said survivor metrics and outputting them as said one-time prior survivor metrics when said ACS means performs a next process;

first minimum value selecting means for receiving said path metrics, including that of said survivor per state, from said ACS, selecting, from said path metrics, those path metrics where most prior transmitted signals in the branches represent a first symbol, and outputting minimum one among said selected path metrics;

second minimum value selecting means for receiving said path metrics, including that of said survivor per state, from said ACS means, selecting, from said path metrics, those path metrics where most prior transmitted signals in the branches represent a second symbol, and outputting minimum one among said selected path metrics; and soft-decision value producing means for outputting a soft-decision value based on the minimum path metrics outputted by said first and second minimum value selecting means, respectively.

13. The receiver according to claim 12, wherein said branch metric producing means erives said branch metric based on the following equation:

$$E_n[XXI_{n-2}I_{n-1}I_n]=[ABS\{r_n-(g_0I_n+g_1I_{n-1}+g_2I_{n-2})\}]^2$$

wherein En $[XXI_{n-2} I_{n-1} I_n]$ represents the branch metric, $r_n$ represents the received signal, $g_0 \ldots g_2$ represent the estimated CIR, $I_n \ldots I_{n-2}$ represent candidates of the transmitted signals per branch held by said branch metric producing means, and X represents an arbitrary transmitted signal.

14. The receiver according to claim 12, wherein said ACS means selects a smaller one of the path metrics $F_n[S^0_{n-1}/S_n]$ and $F_n[S^1_{n-1}/S_n]$ per state as the survivor metric, and outputs the survivor metric and the path metrics $F_n[S^0_{n-1}/S_n]$ and $F_n[S^1_{n-1}/S_n]$, and wherein said path metrics are derived based from the following equations:

$$F_n[S^0_{n-1}/S_n]=E_n[XXI_{n-2}I_{n-1}I_n]+F_{n-1}[S^0_{n-1}]$$

$$F_n[S^1_{n-1}/S_n]=E_n[XXI_{n-2}I_{n-1}I_n]+F_{n-1}[S^1_{n-1}]$$

wherein $E_n$ $[XXI_{n-2} I_{n-1} I_n]$ represents the branch metric, $F_{n-1}$ $[S^0_{n-1}]$ and $F_{n-1}$ $[S^1_{n-1}]$ represent the one-time prior survivor metrics, $S^0_{n-1}/S_n$ represents a "0" branch connected to state $S_n$, and $S^1_{n-1}/S_n$ represents a "0" branch connected to state $S_n$.

15. The receiver according to claim 12, wherein said soft decision value producing means derives said soft-decision value based on the following equation:

$$y_{n-4}=min_0(F_n[S_{n-1}/S_n])-min_1(F_n[S_{n-1}/S_n])$$

wherein $y_{n-4}$ represents the soft-decision value, $min_0$ $(F_n$ $[S_{n-1}/S_n])$ represents an output of the first minimum value selecting means, and $min_1$ $(F_n$ $[S_{n-1}/S_n])$ represents an output of the second minimum value selecting means.

16. The receiver according to claim 12, wherein said ACS means outputs said survivor metrics, said path metrics of the paths including all the branches connected to the respective states and the corresponding survivors, and fairther comprising hard-decision value producing means for receiving said survivors and said survivor metrics thereof to derive a hard-decision value.

17. The receiver according to claim 12, further comprising:

memory length estimating means for deriving the memory length L of the channel and the number V of the transmitted signals forming the state based on the estimated CIR and estimated memory length L outputted from said CIR estimating means, wherein said branch metric producing means derives said branch metrics based on an output of said memory length estimating means.

18. The receiver according to claim 17, wherein said memory length estimating means derives a signal power and intersymbol interference components based on said estimated CIR, corrects said estimated CIR based on said signal power and said intersymbol interference components, and outputs the estimated CIR after correction, said memory length L to said branch metric producing means and said number V of the transmitted signals to said ACS means.

19. The receiver according to claim 12, further comprising:

error power estimating means for deriving an estimated error power based on said received signal and said CIR outputted from the CIR estimating means, wherein said soft-decision value producing means corrects said soft decision value based on said estimated error power.

20. The receiver according to claim 12, further comprising CIR updating means for sequentially updating said estimated CIR based on said received signals and said soft-decision values, and outputting the updated estimated CIR to said branch metric producing means.

* * * * *